(12) United States Patent
Bianchi

(10) Patent No.: US 9,203,371 B2
(45) Date of Patent: Dec. 1, 2015

(54) ELECTRICAL DOUBLE FILTER STRUCTURE

(75) Inventor: Giovanni Bianchi, Nufringen (DE)

(73) Assignee: ADVANTEST CORPORATION, Tokyo (JP)

(*) Notice: Subject to any disclaimer, the term of this patent is extended or adjusted under 35 U.S.C. 154(b) by 175 days.

(21) Appl. No.: 13/700,726

(22) PCT Filed: May 28, 2010

(86) PCT No.: PCT/EP2010/057503
§ 371 (c)(1),
(2), (4) Date: Jan. 31, 2013

(87) PCT Pub. No.: WO2011/147470
PCT Pub. Date: Dec. 1, 2011

(65) Prior Publication Data
US 2013/0200961 A1    Aug. 8, 2013

(51) Int. Cl.
| | | |
|---|---|---|
| H03H 7/09 | (2006.01) | |
| H01P 1/20 | (2006.01) | |
| H03H 7/01 | (2006.01) | |
| H01P 1/203 | (2006.01) | |
| H03H 1/00 | (2006.01) | |

(52) U.S. Cl.
CPC ......... *H03H 7/0138* (2013.01); *H01P 1/20345* (2013.01); *H03H 7/0123* (2013.01); *H03H 7/1758* (2013.01); *H03H 2001/0085* (2013.01); *H03H 2250/00* (2013.01)

(58) Field of Classification Search
CPC ................................ H03H 7/09; H03H 7/38
USPC ......... 333/175, 177, 185, 204, 205, 166–167, 333/202
See application file for complete search history.

(56) References Cited

U.S. PATENT DOCUMENTS

| | | | |
|---|---|---|---|
| 5,583,470 A | 12/1996 | Okubo | |
| 6,097,260 A | 8/2000 | Whybrew et al. | |
| 6,114,925 A * | 9/2000 | Lo | 333/185 |
| 6,147,571 A | 11/2000 | Kitazawa et al. | |
| 6,191,666 B1 * | 2/2001 | Sheen | 333/185 |
| 7,829,424 B2 * | 11/2010 | Miller et al. | 438/379 |

(Continued)

FOREIGN PATENT DOCUMENTS

| | | |
|---|---|---|
| EP | 1 100 193 | 5/2001 |
| EP | 1 933 411 | 6/2008 |
| FR | 2 828 582 | 2/2003 |
| JP | H07 10914 U | 1/1995 |

OTHER PUBLICATIONS

Bianchi, G., et al. "Electronic Filter Design and Simulation" Section 5.1, McGraw-Hill, 2007.

(Continued)

*Primary Examiner* — Dinh Le

(57) ABSTRACT

An electrical filter structure includes a first filter core structure and a second filter core structure. The first filter core structure includes a plurality of shunt impedance elements. Similarly, the second filter core structure includes a plurality of shunt impedance elements. Shunt impedance elements of the first filter core structure are arranged in different conducting layers of a multi-layer structure, and shunt impedance elements of the second filter core structure are arranged in different layers of the multi-layer structure. Transmission lines used to implement the shunt impedance elements are interleaved.

20 Claims, 10 Drawing Sheets

(56) References Cited

U.S. PATENT DOCUMENTS

2002/0130737 A1 9/2002 Hreish et al.
2005/0231304 A1 10/2005 White et al.
2009/0033439 A1 2/2009 Igarashi
2012/0319803 A1* 12/2012 Schick et al. ............ 333/204

OTHER PUBLICATIONS

Penunuri, D., et al. "RF Filter Design Using LTCC and Thin Film BAW Technology" Proc. IEEE Ultrasonics Symposium, pp. 273-278, 2001.

Matthaei, G., et al. "Microwave Filters, Impedance Matching Networks, and Coupling Structures" Chapter 7, McGraw-Hill.
Gupta, K.C., et al. "Computer-Aided Design of Microwave Circuits" Chapter 6, Artech House, 1981.
Hong, J.-S., et al. "Microstrip Filters for Rf/Microwave Applications" Chapters 5 and 6, John Wiley & Sons, Inc., 2001.
Rhea, R.W. "HF Filter Design and Computer Simulation" Chapter 7, Noble Publishing Corporation, 1994.
Somlo, P.I. "The Computation of Coaxial Line Step Capacitances" IEEE Trans. On Microwave Theory and Techniques, vol. MTT-15, No. 1, pp. 48-53, 1967.

* cited by examiner

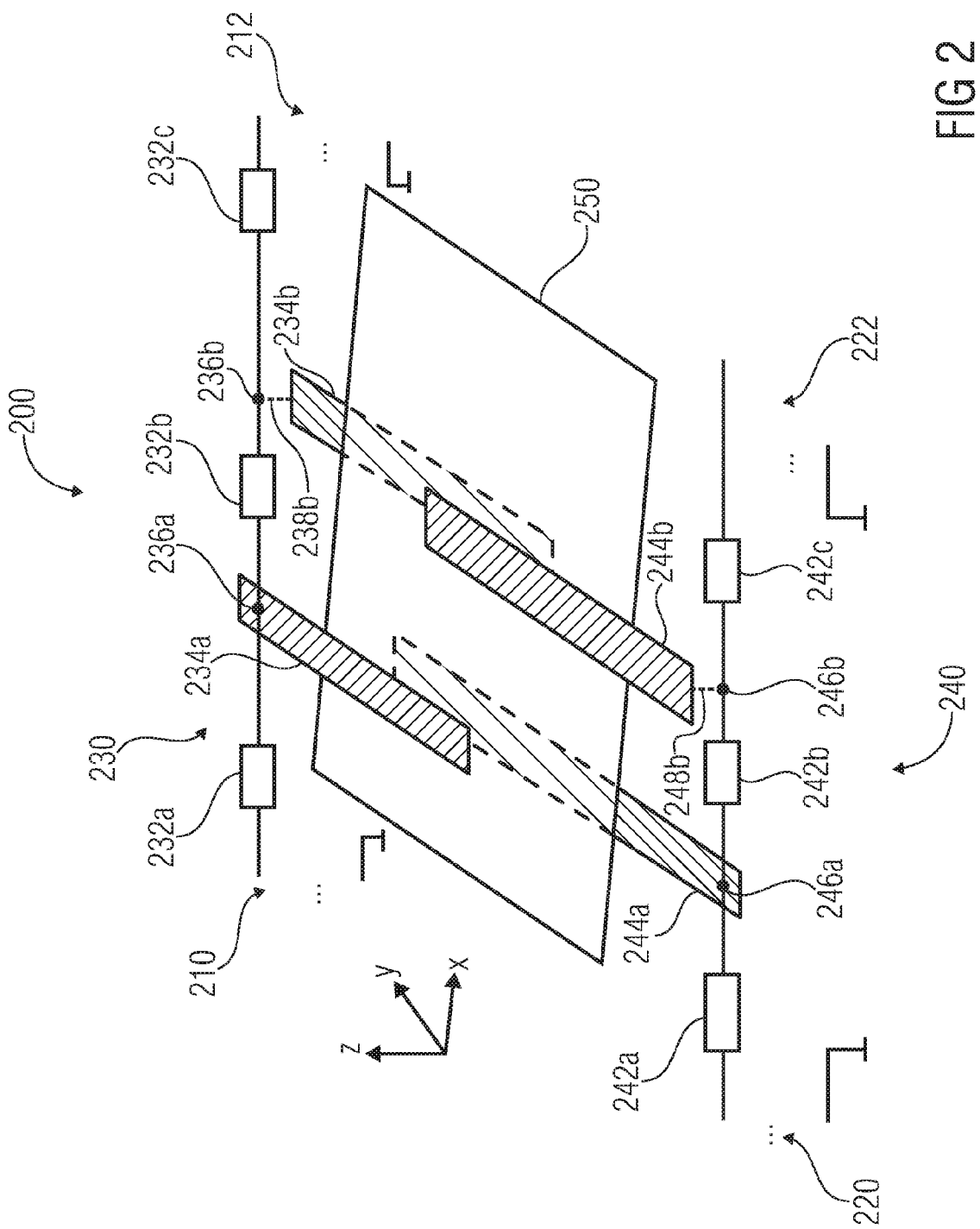

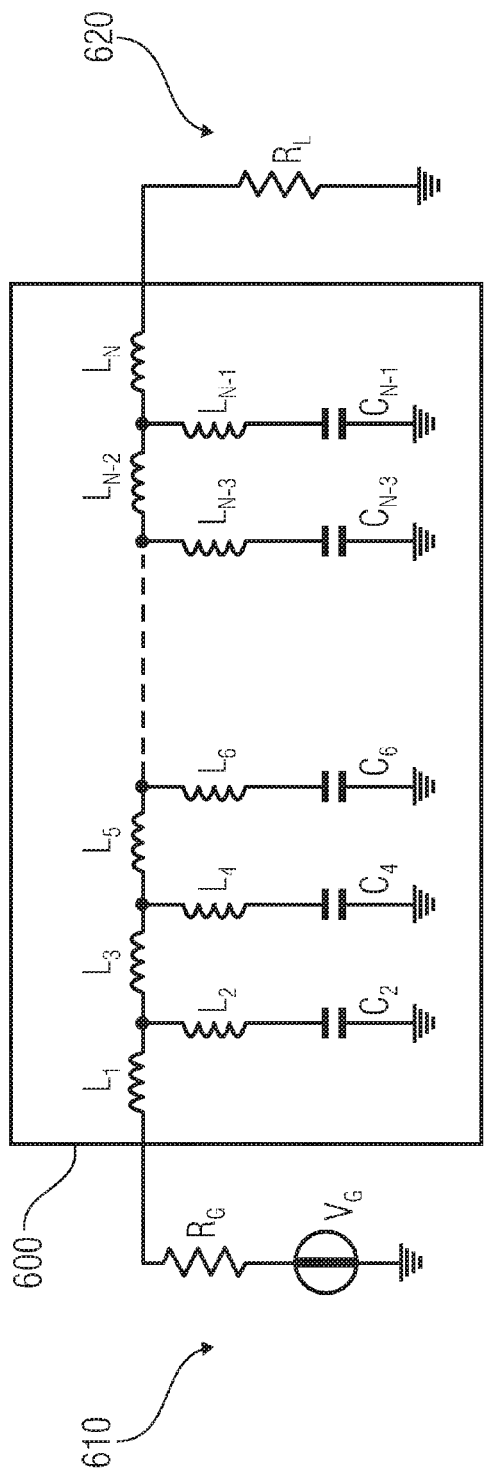
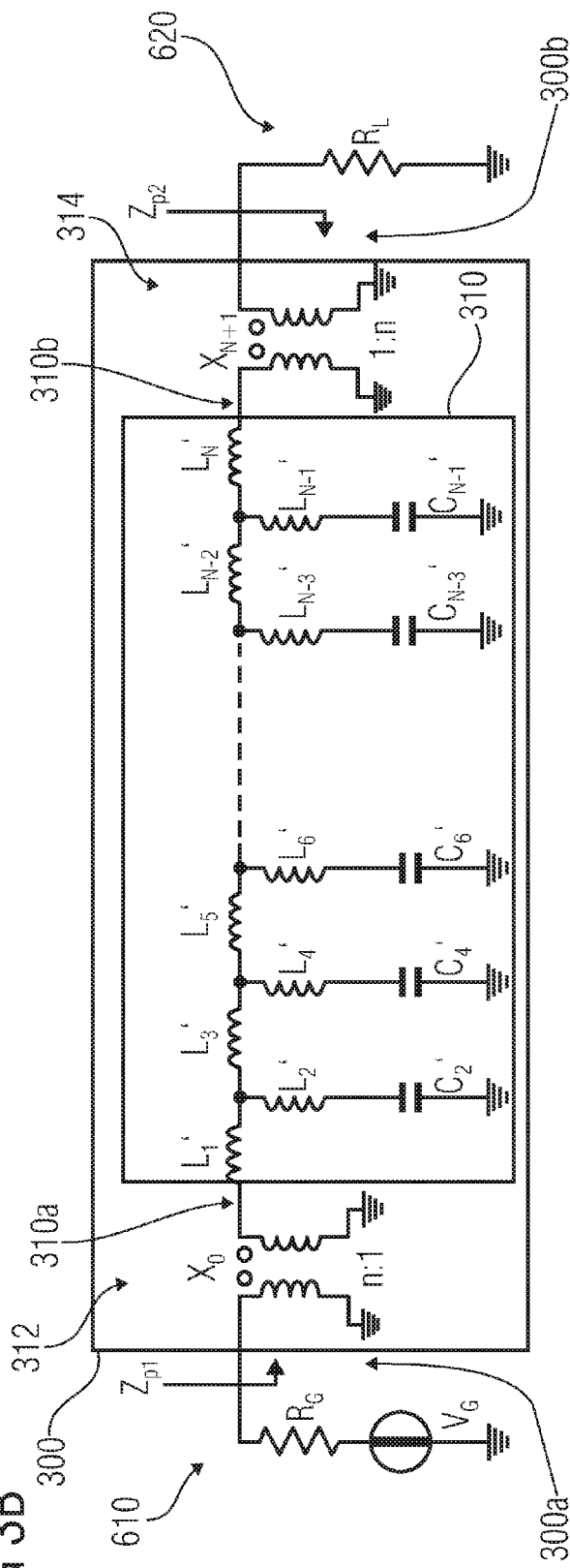
FIG 3A
FIG 3B

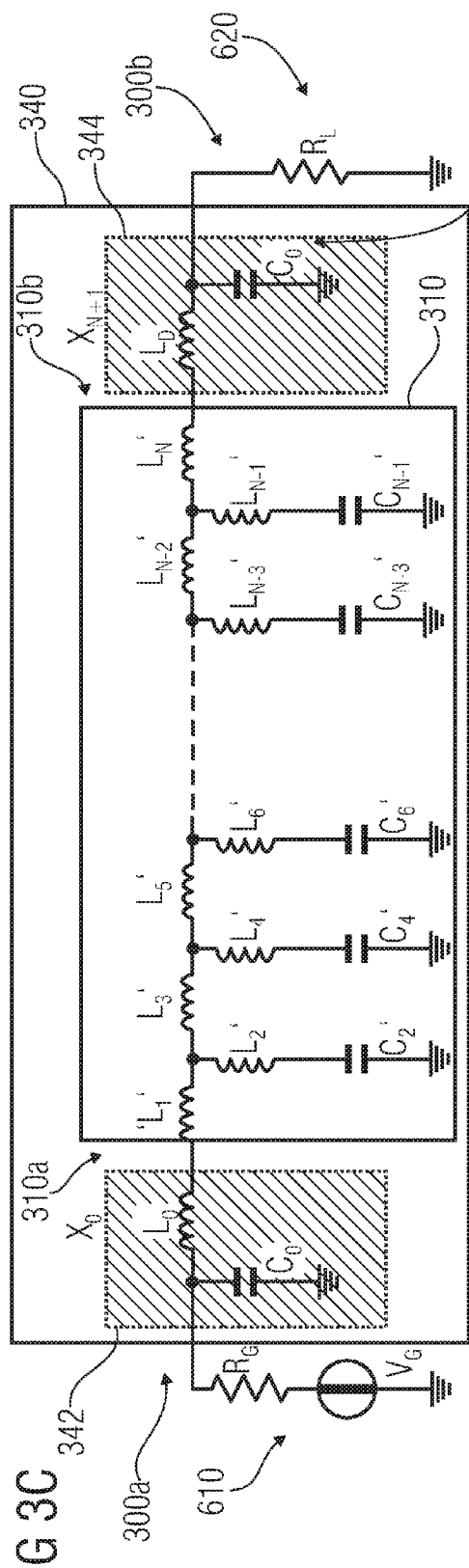
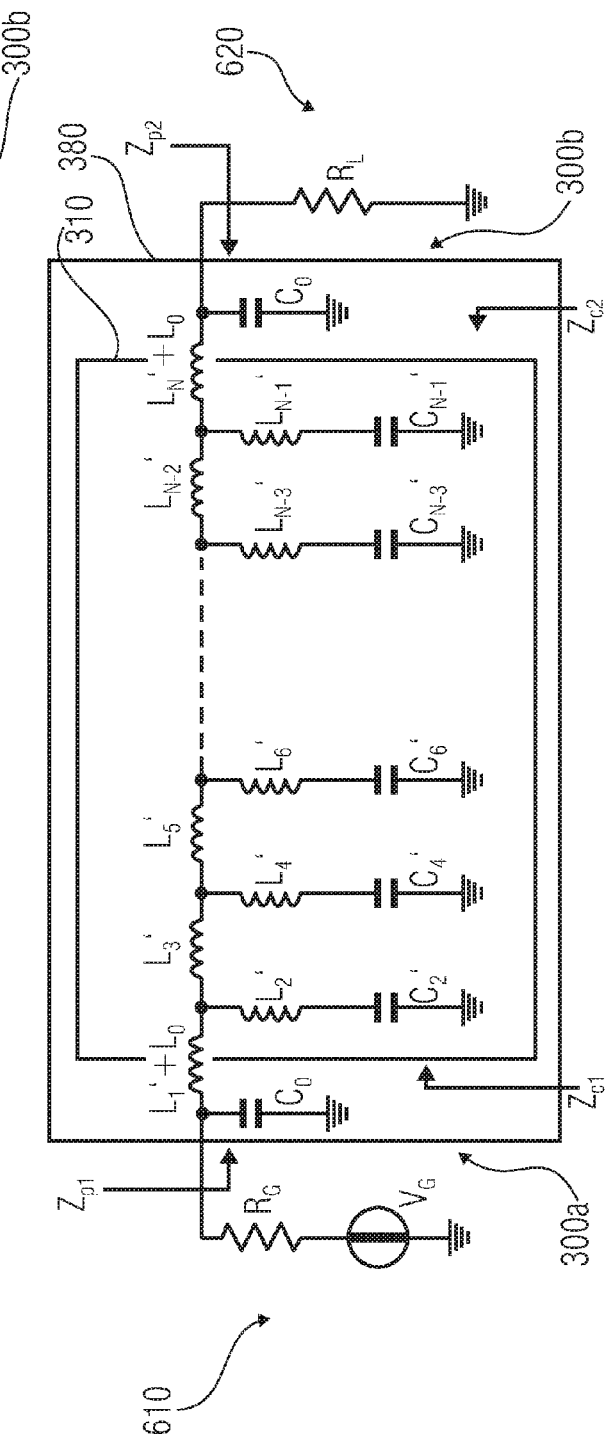

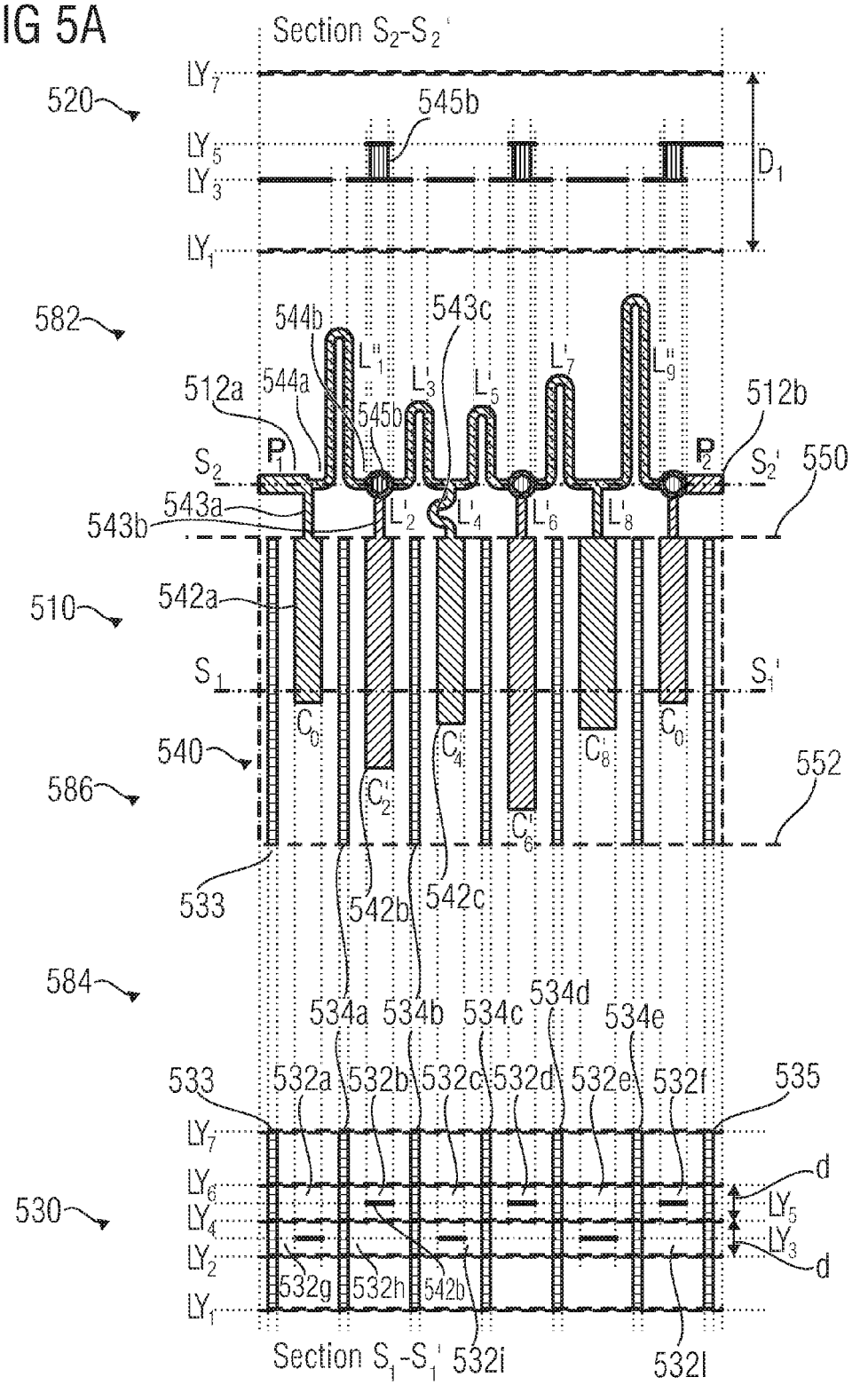
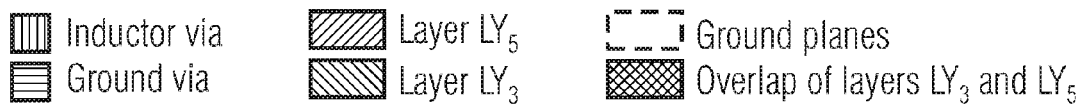

US 9,203,371 B2

ELECTRICAL DOUBLE FILTER STRUCTURE

CROSS-REFERENCE TO RELATED APPLICATIONS

This application is a Continuation of and claims priority to International Application No. PCT/EP2010/057503, filed on May 28, 2010, titled "ELECTRICAL DOUBLE FILTER STRUCTURE AND ITS MULTI-LAYER IMPLEMENTATION," by Giovanni Bianchi, which is herein incorporated by reference

FIELD OF THE INVENTION

Embodiments according to the invention are related to an electrical filter structure for forwarding a first electrical signal from a first filter port to a second filter port in a frequency-selective manner, and for forwarding a second electrical signal from a third filter port to a fourth filter port in a frequency-selective manner.

Some embodiments according to the invention are related to a scaled impedance semi-lumped low-pass filter.

BACKGROUND OF THE INVENTION

Electrical filter structures are used in many applications. For example, electrical filter structures may be implemented to act as a low-pass filter, as a bandpass filter or as a high-pass filter. In the following, a brief introduction will be given to the design of filters.

FIG. 6a shows a schematic of a conventional lumped N-order low-pass filter (also briefly designated with LPF). The filter 600 is placed between a source 610 (modeled by a voltage source having a generator voltage $V_G$ and a resistance having a generator resistance $R_G$) and a load 620 (modeled by a resistor having an impedance $R_L$). Usually, the internal impedance (modeled here by the resistor having the generator resistance $R_G$) and the load impedance (modeled by the resistor having the load resistance $R_L$) are purely resistive. This justifies why FIGS. 6a and 6b represent them as resistors $R_G$ and $R_L$. Moreover, the load impedance $R_L$ and the source impedance $R_G$ are typically coincident (the only relevant exception is the even-order Chebyshev filter) and equal to 50Ω in most cases.

The filter 600 itself consists of floor(N/2) series inductors $L_1, L_3, \ldots, L_N$ and ceil(N/2) shunt series LC cells $L_2\text{-}C_2$, $L_4\text{-}C_4, \ldots, L_{N-1}\text{-}C_{N-1}$. By definition, given a real number x, the function floor(x) returns the smallest integer greater or equal to x, while the function ceil(x) returns the greatest integer smaller or equal to x. More precisely, the inductors of the above mentioned shunt cells are short-circuited in all-poles types of filters, such as Butterworth, Chebyshev, and Bessel.

FIG. 6b shows a schematic of a so-called semi-lumped realization of the (low-pass) filter of FIG. 6a: all the inductors are realized with transmission line segments (also designated as transmission line portions) having (comparatively) high characteristic impedance, and all capacitors are realized with transmission line segments (also designated as transmission line portions) having (comparatively) low characteristic impedance. Herein, the qualifications "high" and "low" denote values which are much greater and much smaller (for example, by a factor of at least 1.5 greater or smaller, but advantageously by a factor of at least two or even and least 3 greater or smaller) than the working impedance (also designated as "internal impedance") of the filter.

However, it has been found that the implementation of the filter structure 600a according to FIG. 6b with good filter characteristics is problematic in some technologies. For example, it has been found that it is sometimes difficult to obtain good broadband characteristics in a real implementation of the filter structure 600a.

Also, it has been found that it is often desirable to implement a plurality of similar filters on a limited area while still maintaining a good isolation between the filters.

In view of this situation, it is an object of the present invention to create an electrical filter structure which brings along a good trade-off between filter characteristics and implementation area requirements.

SUMMARY

According to an embodiment, an electrical filter structure for forwarding a first electrical signal from a first filter port to a second filter port in a frequency-selective manner, and for forwarding a second electrical signal from a third filter port to a fourth filter port in a frequency-selective manner may have: a first filter core structure having the first filter port, the second filter port, a plurality of series impedance elements electrically coupled between the first filter port and the second filter port and a plurality of shunt impedance elements, wherein the shunt impedance elements of the first filter core structure are implemented using transmission line structures coupled to nodes, which are electrically coupled between subsequent series impedance elements of the first filter core structure; and a second filter core structure having the third filter port, the fourth filter port, a plurality of series impedance elements electrically coupled between the third filter port and the fourth filter port and a plurality of shunt impedance elements, wherein the shunt impedance elements of the second filter core structure are implemented using transmission line structures coupled to nodes, which are electrically coupled between subsequent series impedance elements of the second filter core structure; wherein the shunt impedance elements of the first filter core structure are arranged in different conducting layers of a multi-layer structure; wherein the shunt impedance elements of the second filter core structure are arranged in different conducting layers of the multi-layer structure; and wherein a transmission line structure used to implement a first shunt impedance element of the first filter core structure and a transmission line structure used to implement a second shunt impedance element of the second filter core structure are arranged in the same conducting layer of the multi-layer structure; and wherein a transmission line structure used to implement a second shunt impedance element of the first filter core structure and a transmission line structure used to implement a first shunt impedance element of the second filter core structure are arranged in the same conducting layer of the multi-layer structure, and wherein the transmission line structure used to implement the first shunt impedance element of the first filter core structure and the transmission line structure used to implement the first shunt impedance element of the second filter core structure are at least partly overlapping in a projection perpendicular to a main surface of the multi-layer structure with a conductive shielding in between, and wherein the transmission line structure used to implement the second shunt impedance element of the second filter core structure and the transmission line structure used to implement the second shunt impedance element of the first filter core structure are at least partly overlapping in a projection perpendicular to a main surface of the multi-layer structure with a conductive shielding in-between; wherein the main surface is parallel to the conducting layers, or wherein the main surface is formed by a top conducting layer or a bottom conducting layer.

An embodiment according to the invention creates an electric filter structure for forwarding a first electrical signal from a first filter port to a second filter port in a frequency-selective manner, and for forwarding a second electrical signal from a third filter port to a fourth filter port in a frequency-selective manner.

The filter structure comprises a first filter core structure comprising a first filter port (which may be a filter core port), a second filter port (which may be a filter core port), a plurality of series impedance elements electrically coupled between the first filter port and the second filter port and a plurality of shunt impedance elements. The shunt impedance elements of the first filter core structure are implemented using transmission line structures coupled to nodes, which are electrically coupled between subsequent series impedance elements of the first filter core structure.

The electric filter structure also comprises a second filter core structure comprising a third filter port (which may be a filter core port), a fourth filter port (which may be a filter core port), a plurality of series impedance elements electrically coupled between the third filter port and the fourth filter port and a plurality of shunt impedance elements. The shunt impedance elements of the second filter core structure are implemented using transmission line structures coupled to nodes, which are electrically coupled between subsequent series impedance elements of the second filter core structure.

The shunt impedance elements of the first filter core structure are arranged in different conducting layers of a multi-layer structure, and the shunt impedance elements of the second filter core structure are also arranged in different conducting layers of the multi-layer structure.

A transmission line structure used to implement a first shunt impedance element of the first filter core structure and a transmission line structure used to implement a second shunt impedance element of the second filter core structure are arranged in the same conducting layer of the multi-layer structure. Similarly, a transmission line structure used to implement a second shunt impedance element of the first filter core structure and a transmission line structure used to implement a first shunt impedance element of the second filter core structure are arranged in the same conducting layer of the multi-layer structure.

The transmission line structure used to implement the first shunt impedance element of the first filter core structure and the transmission line structure used to implement the first shunt impedance element of the second filter core structure are at least partly overlapping in a projection perpendicular to a main surface of the multi-layer structure, with a conductive shielding in between. Similarly, the transmission line structure used to implement the second shunt impedance element of the second filter core filter structure and the transmission line structure used to implement the second shunt impedance element of the first filter core structure are at least partly overlapping in a projection perpendicular to a main surface of the multi-layer structure, with a conductive shielding in between.

It is an embodiment of the present invention that the above-described interleaved arrangement of transmission line structures, which are used to implement shunt impedance elements of two filter core structures, allows for a particularly space-saving implementation of two electrically-independent filter core structures, wherein the distribution of transmission line structures used to implement shunt impedance elements of a given one of the filter core structure allows to include vertical structures, like, for example, via structures, in the filter design. This gives an additional degree of freedom in the design. On the other hand, the interleaved arrangement of the shunt transmission line structures of two filter core structures allows for a very space-saving arrangement, wherein a good isolation between the two filter core structures can nevertheless be obtained by using a conductive shielding. Accordingly, the filter structure described above can be used to obtain two electrical filters (or filter core structures), an areas consumption of which is significantly reduced when compared to the area consumption of two separate filters.

In an advantageous embodiment, the shunt impedance elements of the first filter core structure are arranged in different conducting layers of the multi-layer structure, such that a via impedance is arranged in series with at least one of the shunt impedance elements of the first filter core structure. Similarly, the shunt impedance elements of the second filter core structure are arranged in different conducting layers of the multi-layer structure, such that a via impedance is arranged in series with at least one of the shunt impedance elements of the second filter core structure. By exploiting via impedances in the filter structure, lateral dimensions of the filter core structure can typically be reduced somewhat, because the usage of a via, which is approximately perpendicular to the conducting layers, allows to make use of the third dimension of the multi-layer structure.

In an advantageous embodiment, the transmission line structures used to implement the shunt impedance elements of the first filter core structure are alternatingly arranged in a first conducting layer and a second conducting layer of the multi-layer structure. Similarly, the transmission line structures used to implement the shunt impedance elements of the second filter core structure are alternatingly arranged in the second conducting layer and the first conducting layer of the multi-layer structure. Also, a plurality of corresponding pairs of transmission line structures of the first and second filter core structures are at least partially overlapping in a projection perpendicular to a main surface of the multi-layer structure with a conducting shielding in between. By alternatingly arranging the transmission line structures used to implement shunt impedance elements of a filter core structure in different conducting layers, a stop band isolation of the filter can be optimized.

In an advantageous embodiment, the filter structure comprises at least two rows of electrically shielded regions (also designated as sub-regions) bounded by ground layers of the multi-layer structure and vertical ground structures of the multi-layer structure. The two rows of electrically shielded regions (sub-regions) are arranged stacked in a direction perpendicular to a main surface of the multi-layer structure. In this case, transmission line structures used to implement shunt impedance elements of the first filter core structure are alternatingly arranged in electrically shielded regions of an upper one of the rows and electrically shielded regions of a lower one of the rows. Similarly, transmission line structures used to implement shunt impedance elements of the second filter core structure are alternatingly arranged in electrically shielded regions of the upper one of the rows (of electrically shielded regions) of the lower one of the rows in which electrically shielded regions there are no transmission line structures used to implement the shunt impedance elements of the first filter core structure. Accordingly, very good mutual shielding of the transmission line structures used to implement the shunt impedance elements of the first filter core structure and of the second filter core structure can be obtained. The shielding is given both between vertically adjacent transmission line structures (e.g. transmission line structures which are at least partially overlapping in a projection perpendicular to the main surface of the multi-layer stack) and horizontally adjacent transmission line structures (e.g. transmission line structures which are arranged in the same conducting layer).

In an advantageous embodiment, the transmission line structures used to implement the shunt impedance elements of the first and second filter core structures are arranged such that electrically shielded regions of a row of electrically shielded regions comprise an interleaved sequence of transmission line structures of the first filter core structure and of transmission line structures of the second filter core structure. Accordingly, the advantages discussed above with respect to the interleaved arrangement can be obtained.

In an advantageous embodiment, the filter structure comprises (at least) three parallel ground layers, wherein the three parallel ground layers are connected by a plurality of parallel vertical ground structures (which are typically perpendicular to the ground layers), to obtain a plurality of substantially brick-shaped electrically shielded regions bounded at (at least) four sides by two of the ground layers and two of the parallel vertical ground structures. In this case, the transmission line structure used to implement the first shunt impedance element of the first filter core structure is arranged in a first of the brick-shaped electrically shielded regions, and the transmission line structure used to implement the first shunt impedance element of the second filter core structure is arranged in a second of the brick-shaped electrically shielded regions, which is vertically adjacent to the first brick-shaped electrically shielded region. The transmission line structure used to implement the second shunt impedance element of the first filter core structure is arranged in a third of the brick-shaped electrically shielded regions, which is horizontally adjacent to the second brick-shaped electrically shielded region, and the transmission line structure used to implement the second shunt impedance element of the second filter core structure is arranged in a fourth of the brick-shaped electrically shielded regions, which is horizontally adjacent to the first brick-shaped electrically shielded region and vertically adjacent to the third of the brick-shaped electrically shielded regions.

In an advantageous embodiment, the second filter core structure is configured to forward a second signal, which is electrically separate from the first signal. As discussed above, the good isolation of the two filter core structures allows for the transmission of electrically independent signals.

In an advantageous embodiment, the filter structure comprises a central portion (also designated as central region), wherein the central portion comprises at least three ground layers having a first spacing d between adjacent ones of the ground layers. In this case, the filter structure comprises a first outer portion (also designated as first outer region), which first outer portion comprises an upper ground layer and a lower ground layer having a second spacing D1. The filter structure also comprises a second outer portion (also designated as second outer region), wherein the second outer portion comprises an upper ground layer and a lower ground layer having a third spacing D2 (which may or may not be identical to the second spacing D1). The central portion is arranged between the first outer portion and the second outer portion. Transmission line portions used to implement series inductances of the first filter core structure are arranged in the first outer portion, such that the transmission line portions used to implement the series inductances of the first filter core structure are symmetric or asymmetric strip lines having a total strip line height of D1. Similarly, transmission line portions used to implement series inductances of the second filter core structure are arranged in the second outer portion, such that the transmission line portions used to implement the series inductances of the second filter core structure are symmetric or asymmetric strip lines having a total strip line height of D2. Transmission line portions used to implement capacitances of the shunt impedance elements are arranged between two adjacent ground layers of the central portion, such that the transmission line portions used to implement capacitances of the shunt impedance elements of the first and second filter core structures are symmetric or asymmetric strip lines having a total strip line height of d. In this case, d is smaller than $D_1$, and also smaller than $D_2$.

Accordingly, it is possible to implement both the high impedance transmission lines of the filter core structures and the low impedance transmission lines of the filter core structures in a very efficient form. By providing different strip line height for the high impedance transmission lines and the low impedance transmission lines, an excessive variation of the transmission line width can be avoided. In particular, the width of the transmission lines used to implement the capacitances of the shunt impedance elements can be kept reasonably small, which helps to save area and which also helps to avoid a degradation of the filter characteristics which would be caused by excessively broad transmission lines.

In an advantageous embodiment, the shunt impedance elements comprise a higher impedance portion which extends from nodes at which subsequent series impedance elements are coupled to a respective boundary between a respective one of the outer portions and the central portion. The shunt impedance elements also comprise a low impedance portion, which extends from the respective boundary towards a respective opposite boundary of the central region. In this way, it is possible to implement series resonant circuits as the shunt impedance elements, wherein the inductance of a shunt impedance element is implemented in the outer region, where there is a large strip line height $D_1$, $D_2$, and wherein the capacitance of the shunt impedance element is implemented in the central portion, where there is a strip line height of d.

In an advantageous embodiment, the filter structure is axially symmetric with respect to a central axis located in the central region. In this manner, two electrically independent filter structures can be implemented in a small space.

In an advantageous embodiment, the first filter core structure is a low-pass filter and the second filter core structure is also a low-pass filter. It has been found that the embodiments of the present invention are particularly well-suited for the implementation of low-pass filters.

In an advantageous embodiment, the filter structure comprises a first (external) filter port having a first characteristic port impedance and a second (external) filter port having a second characteristic port impedance, wherein a working impedance of the first filter core structure is different from the first characteristic port impedance and from the second characteristic port impedance. In this case, the filter structure comprises a first matching arrangement electrically coupled between the first (external) filter port and the first filter core structure, wherein the first matching arrangement is configured to perform an impedance matching between the first characteristic port impedance and a characteristic impedance presented by the first filter core structure to the first matching arrangement. Similarly, the filter structure comprises a second matching arrangement electrically coupled between the second (external) filter port and the first filter core structure, wherein the second matching arrangement is configured to perform an impedance matching between the second characteristic port impedance and the characteristic impedance presented by the first filter core structure to the second matching arrangement. It has been found that the inventive double filter structure is well-suited for a combination with an impedance scaling of the filter core structure. The impedance scaling of the filter core structure allows for a simplified implementation of the transmission line structure and helps reduce parasitics of the transmission line structures (for example, a parasitic capacitance of the transmission line structures is used to implement inductances). Accordingly, the filter characteristics (for example, the stop-band rejection) of the filter structure can be improved, and the size of the filter can also be reduced.

BRIEF DESCRIPTION OF THE DRAWINGS

Embodiments of the present invention will be detailed subsequently referring to the appended drawings, in which:

FIG. 2 shows a block schematic diagram of another exemplary filter structure, according to another embodiment of the invention;

FIG. 3a shows a schematic of a standard lumped low-pass filter, together with a source and a load;

FIG. 3b shows a schematic of a filter derived from the standard lumped low-pass of FIG. 3a after scaling the internal impedance, together with a source and a load;

FIG. 3c shows a schematic of another filter derived from the standard lump low-pass of FIG. 3a after scaling the internal impedance, with a L-network implementation of the ideal transformers, together with a source and a load; and FIG. 3d shows a schematic of a filter structure, which is obtained by rearrangement of the elements of the filter of FIG. 3c, together with a source and a load;

FIG. 5a shows a graphical representation of a first filter of an interleaved realization of two filters in a multi-layer printed circuit board;

DETAILED DESCRIPTION OF THE INVENTION

Figure 1:
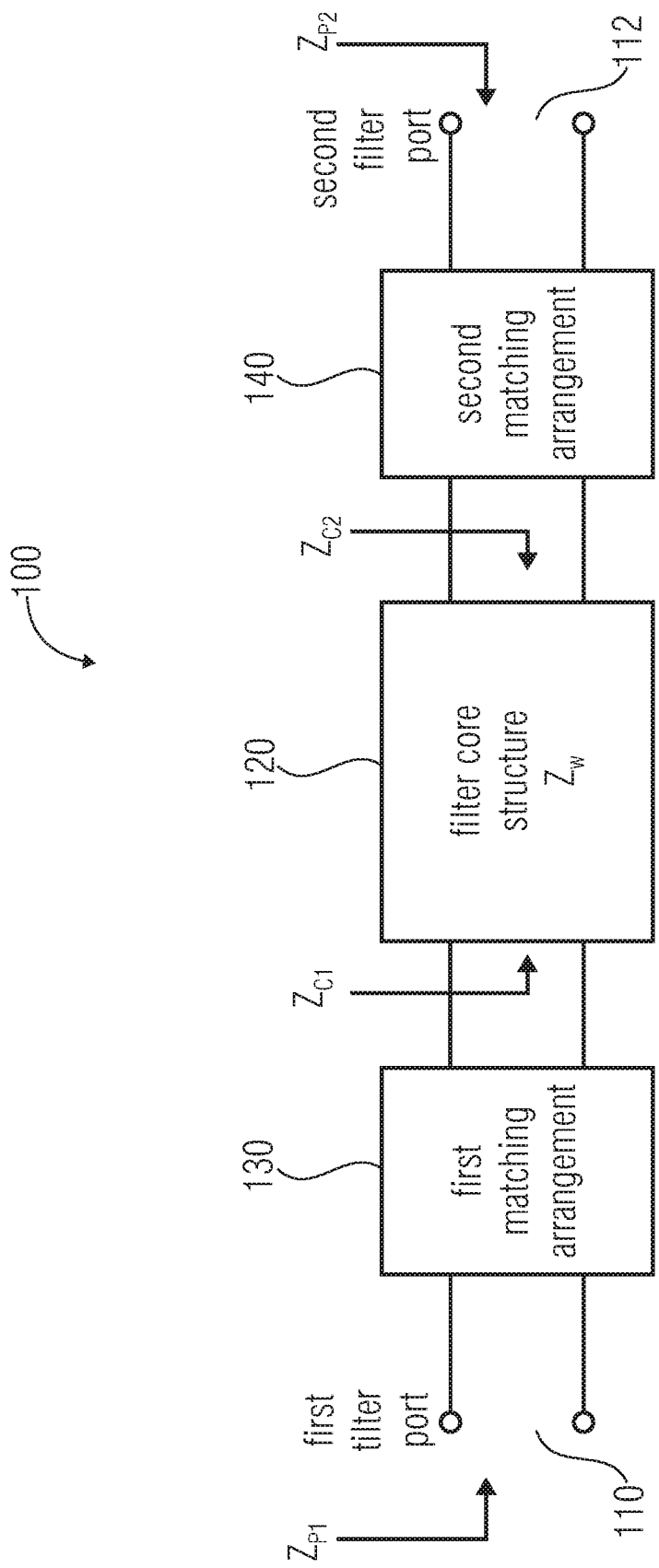
FIG. 1 shows a block schematic diagram of an exemplary electrical filter structure, according to a first embodiment of the invention.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "allocating," "associating," "moving," "copying," "setting," "accessing," "erasing," "freeing," "controlling," "adding," "recording," "determining," "identifying," "caching," "maintaining," "incrementing," "comparing," "removing," "reading," "writing," or the like, refer to actions and processes of a computer system or similar electronic computing device or processor. The computer system or similar electronic computing device manipulates and transforms data represented as physical (electronic) quantities within the computer system memories, registers or other such information storage, transmission or display devices.

1. FILTER STRUCTURE ACCORDING TO FIG. 1

In the following, an exemplary filter structure 100 will be described. A block schematic diagram of the filter structure 100 is shown in FIG. 1.

The filter structure 100 is configured to forward an electrical signal from a first (external) filter port 110 to a second (external) filter port 112 in a frequency-selective manner, to implement, for example, a low-pass filter characteristic, a high-pass filter characteristic or a band-pass filter characteristic. The first filter port 110 comprises a first characteristic port impedance $Zp_{P1}$, and the second filter port 112 comprises a second characteristic port impedance $Z_{P2}$.

The filter structure 100 also comprises a filter core structure 120 having a working impedance $Z_W$, wherein the working impedance is different from the first characteristic port impedance $Z_{p1}$ and from the second characteristic port impedance $Z_{P2}$. The working impedance of the filter core structure 120 describes an impedance level of the filter core structure. In many cases, the working impedance of the filter core structure is equal to a characteristic impedance presented by the filter core structure at the ports of the filter core structure in the pass band. In other words, the working impedance of the filter core structure is typically equal to an impedance level which should be present at the input and at the output of the filter core structure in order to obtain a minimum insertion loss in the passband. For semi-lumped implementations, the working impedance of the filter is typically between the transmission line impedance of a low-impedance transmission line and the transmission line impedance of a high-impedance transmission line. The working impedance (or inner impedance) of the filter may for example be equal to an arithmetic or geometric mean of the impedances of the high impedance transmission lines and the low impedance transmission lines.

The filter structure 100 also comprises a first matching arrangement 130, which is electrically coupled between the first filter port 110 and the filter core structure 120. The first matching arrangement 130 is configured to perform an impedance matching between the first characteristic port impedance $Z_{p1}$ and a characteristic impedance $Z_{a1}$ presented by the filter core structure 120 to the first matching arrangement 130. In addition, the filter structure 100 also comprises a second matching arrangement 140 electrically coupled between the second filter port 112 and the filter core structure 120. The second matching arrangement 140 is configured to perform an impedance matching between the second characteristic port impedance $Z_{p2}$ and the characteristic impedance $Z_{C2}$ presented by the filter core structure 120 to the second matching arrangement 140.

Herein, the term "characteristic impedance" designates an impedance for which a desired filter characteristic (for example a minimum insertion loss in a passband) occurs.

The filter structure 100 allows for the implementation of the filter core structure, such that parasitics of the lumped or semi-lumped impedance elements can be kept sufficiently small. Thus, the working impedance of the filter core structure, which is also sometimes designated as the "internal impedance of the filter," can be scaled to an appropriate level, $Z_w$, which is different from the characteristic port impedances $Z_{P1}$, $Z_{P2}$, and which is appropriate for a good implementation of the filter core structure 120. The input or the output of the filter core structure 120 are matched to the desired external impedances, e.g. to the first (characteristic) port impedance $Z_{P1}$ and the second (characteristic) port impedance $Z_{P2}$, using matching networks, e.g. the first matching arrangement 130 and the second matching arrangement 140. Accordingly, the sensitivity of a standard lumped filter or semi-lumped filter to parasitic shunt capacitances associated with each inductor may, for example, be reduced.

To summarize, the filter structure 100 according to FIG. 1 allows to obtain sufficiently good pass band characteristics and stop band characteristics, wherein it is typically possible to obtain, using a given technology, better characteristics than it would be possible using a filter core structure having a working impedance which is equal to the port impedances $Z_{P1}$, $Z_{P2}$.

Further Details regarding the design of the Filter Structure 100 will be discussed below.

2. FILTER STRUCTURE ACCORDING TO FIG. 2

FIG. 2 shows a schematic representation of an exemplary filter structure, according to another embodiment of the invention.

The filter structure 200 of FIG. 2 may be considered as a double filter structure and is configured for forwarding a first electrical signal from a first filter port 210 to a second filter port 212 in a frequency-selective manner, and for forwarding a second electrical signal from a third filter port 220 to a fourth filter port 222 in a frequency-selective manner.

The filter structure 200 comprises a first filter core structure 230 comprising a first filter port 210, a second filter port 212, a plurality of series impedance elements 232a, 232b, 232c electrically coupled between the first filter port 210 and the second filter port 212 and a plurality of shunt impedance elements 234a, 234b. The shunt impedance elements 234a, 234b of the first filter core structure 230 are implemented using transmission line structures coupled to nodes 236a, 236b, which are electrically coupled between subsequent series impedance elements 232a, 232b; 232b, 232c of the first filter core structure 230.

The filter structure 200 also comprises a second filter core structure 240 comprising a third filter port 220, a fourth filter port 222, a plurality of series impedance elements 242a, 242b, 242c electrically coupled between the third filter port 220 and the fourth filter port 222 and a plurality of shunt impedance elements 244a, 244b. The shunt impedance elements 244a, 244b of the second filter core structure 240 are implemented using transmission line structures coupled to nodes 246a, 246b, which are electrically coupled between subsequent series impedance elements 242a, 242b; 242b, 242c of the second filter core structure 240.

The shunt elements 234a, 234b (or more precisely, transmission line structures used to implement said shunt impedance elements) of the first filter core structure 230 are arranged in different conducting layers of a multi-layer structure, such that, advantageously but not necessarily, a via impedance (of a via 238b) is arranged in series with at least one of the shunt impedance elements 234b of the first filter core structure 230. The shunt impedance elements 244a, 244b (or more precisely, transmission line structures used to implement said shunt impedance elements) of the second filter core structure 240 are arranged in different conducting layers of the multi-layer structure, such that, advantageously but not necessarily, a via inductance (of a via 248b) is arranged in series with at least one of the shunt impedance elements 244b of the second filter core structure 240.

The transmission line structure used to implement the first shunt impedance element 234a of the first filter core structure 230 and the transmission line structure 244b used to implement a second shunt impedance element of the second filter core structure 240 are arranged in a same (e.g. a common) conducting layer of the multi-layer structure. Similarly, the transmission line structure 234b used to implement a second shunt impedance element of the first filter core structure 230 and the transmission line structure 244a used to implement a first shunt impedance element of the second filter core structure 240 are arranged in a same (e.g. in a common) conducting layer of the multi-layer structure.

The transmission line structure 234a used to implement the first shunt impedance element of the first filter core structure 230 and the transmission line structure 244a used to implement the first shunt impedance element of the second filter core structure 240 are at least partly overlapping in a projection perpendicular to a main surface (which main surface is typically parallel to the conducting layers, or may even be formed by a top conducting layer or a bottom conducting layer) of the multi-layer structure with a conductive shielding 250 in between. The transmission line structure 244b used to implement the second shunt impedance element of the second filter core structure 240 and the transmission line structure 234b used to implement the second shunt impedance element of the first filter core structure 230 are at least partly overlapping in a projection perpendicular to a main surface of the multi-layer structure with the conductive shielding 250 in between.

The filter structure (or double filter structure) 200 of FIG. 2 allows a very compact implementation of a filter structure, while it is still possible to exploit via impedances, which can be obtained by arranging the transmission line structures 234a, 234b, 244a, 244b used to implement the shunt impedance elements in different conducting layers of the multi-layer structure. It is appreciated, a spatial interleaving of the transmission line structures 234a, 234b, 244a, 244b can be obtained both in a direction z perpendicular to a main surface of the multi-layer structure and in a direction x which is parallel to the main surface of the multi-layer structure (and which direction x may be identical to a main propagation direction or average propagation direction from the input ports 210, 220 of the filter core structures 230, 240 to the output ports 212, 222 of the filter core structures 230, 240. Thus, the filter structure 200 performs better than a planar filter structure in which all the shunt impedance elements are implemented in the same conducting layer.

Also, the area and number of layers that may be used for the implementation of the filter structure 200 is typically significantly smaller than the area that may be used for the implementation of two separate filter structures.

Naturally, the filter structure 200 can be combined with a matching arrangement 130, 140 discussed above, wherein one or more of the matching arrangements may be connected between the ports 210, 212, 220, 222 and corresponding external filter ports. Thus, a working impedance of the filter structure 200 may be different from an impedance of transmission lines coupled to the filter structure 200. Also, the filter structure 200 may, for example, serve as the filter core structure 120.

Further details will be discussed in the following.

3. FILTER STRUCTURES ACCORDING TO FIGS. 3a TO 3d

In the following, details regarding the design of an impedance-scaled low pass filter will be described taking reference to FIGS. 3a to 3d. Reference is also made to the general design rules for a filter, which have been discussed with reference to FIGS. 6a and 6b.

3.1. General Design Rules

Figure 6A:
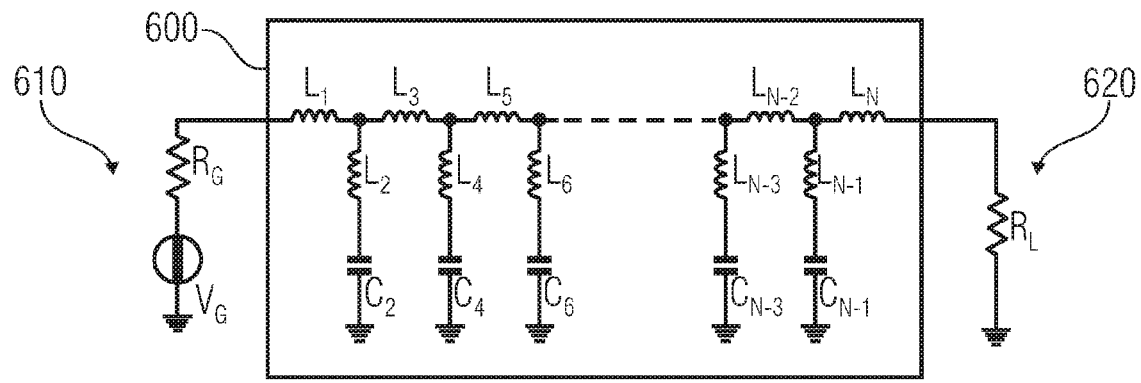
FIG. 6a shows a schematic of a lumped low-pass filter.
Figure 6B:
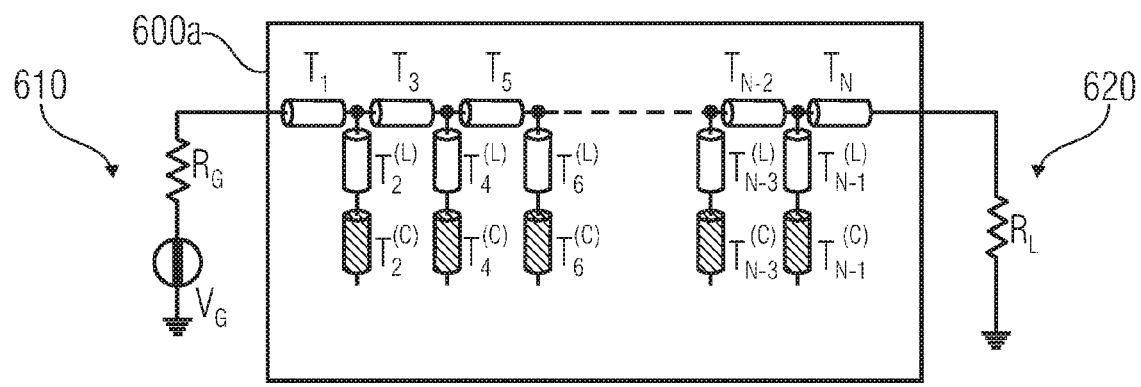
FIG. 6b shows a schematic of a semi-lumped low-pass filter.

As outlined above, FIG. 6a shows a schematic of a conventional lumped N-order low-pass filter (LPF). The filter is placed between a source ($V_G$, $R_G$) and a load ($R_L$). Usually, the internal impedance of the source ($R_G$) and the load impedance ($R_L$) are purely resistive: this justifies why the drawings of FIGS. 6a and 6b represent them as resistors. Moreover, load and source impedance are typically coincident and equal to 50Ω in most cases. The filter itself consists of floor(N/2) series inductors ($L_1, L_3, \ldots L_N$) and ceil(N/2) shunt series LC cells ($L_2$-$C_2$, $L_4$-$C_4$, $\ldots$, $L_{N-1}$-$C_{N-1}$). More precisely, the inductors of the above-mentioned shunt cells are short-circuited in all-poles types of filters, such as Butterworth, Chebyshev and Bessel.

FIG. 6b shows a so-called semi-lumped realization of the filter in FIG. 6a: all the inductors (capacitors) are realized with transmission line segments having high (low) characteristic impedance. Herein, the qualifications "high" and "low" denote values which are much greater and much smaller than the working impedance of the filter.

3.2. Technological Background Considerations

In the following, it will be discussed how an impedance-scaled filter can be derived from a conventional filter described in FIGS. 6a and 6b. It should be noted that obtaining impedance values which are much greater and much smaller than the working impedance of the filter is specifically the performance to obtain, in which the embodiments of the present invention help. In other words, the embodiments of the present invention allow the use of a working impedance of the filter core structure such that transmission line structures having an impedance which is significantly smaller than the working impedance and transmission line structures having an impedance which is significantly larger than the working impedance can both be implemented using a readily available technology and at moderate effort.

Some embodiments, according to the invention, are related to a multi-layer printed circuit—such as low-temperature co-fired ceramic (LTCC)—realization of the network shown in FIG. 6b. Both microstrip and strip line implementations are in principle possible, although the latter presents advantages from the utilization point of view in that it is inherently totally shielded.

In this regard, typical numbers for the strip line are: substrate thickness B=1 mm, dielectric relative permittivity $\in_r$=8, and minimum realizable width w=0.1 mm. With these values, the maximum achievable characteristic impedance is about 69Ω, which is not significantly higher than 50Ω (which is the typical standard transmission line impedance).

It has been found that this would lead to a poor stop-band response (low rejection) of the filter. It has also been found that in order to improve this performance, it would be useful to increase the substrate thickness B and/or to reduce the strip line with w. Unfortunately, it has been found that the characteristic impedance is approximately proportional to the logarithm of the ratio B/w. Therefore, a small increase of the characteristic impedance involves a large reduction of w, with the consequent criticality in the realization process and high associated series resistance, and/or an increase of B, thus increasing the number of stacked layers or the individual layer thickness. Shortly, both these solutions are impractical or at least costly. More in general, in the implementation of a series inductor (or series inductance) will exhibit high parasitic shunt capacitance.

3.3. Design of an impedance-scaled filter according to FIG. 3b

In the following, improvements, which can be obtained on the basis of the above-discussed will be explained in detail.

It should be noted here that FIGS. 3a to 3d show schematics of standard and impedance-scaled low pass filters.

FIG. 3a shows a standard lumped low pass. FIG. 3a is identical to FIG. 6a and is replicated here for clarity.

FIG. 3b shows a schematic of a filter derived from the filter of FIG. 3a after scaling the internal impedance. In other words, the schematic of FIG. 3b depicts a principle diagram of an embodiment of the present invention to circumvent the problem, which is a scaled-impedance low-pass filter (SILPF). The internal impedance of the filter (or filter core structure) is smaller than the one of the source 610 (for example, a voltage source having a no-load voltage $V_G$ and the inner resistance $R_G$) and of the load 620 (for example, a resistor having a resistance $R_L$), while two ideal transformers 312, 314 (also designated with $X_0$, $X_{N+1}$) match the filter on source and load again.

Given the internal impedance of the filter $R_{FILT}$ that may be used for optimum inductor performance, the transforming ratio of the transformers 312, 314 ($X_0$, $X_{N+1}$) is $$n = \sqrt{\frac{R_G}{R_{FILT}}} = \sqrt{\frac{R_L}{R_{FILT}}} \tag{1}$$

Consequently, the elements values of the scaled impedance filter are $$L'_k = \frac{L_k}{n^2} = \frac{R_{FILT}}{R_G} L_k = \frac{R_{FILT}}{R_L} L_k \quad (2)$$
$$(k = 1, 2, \ldots N)$$

And $$C'_k = n^2 \cdot C_k = \frac{R_G}{R_{FILT}} C_k = \frac{R_L}{R_{FILT}} C_k \quad (3)$$
$$[k = 2, 4, 6, \ldots \text{floor}(N/2)].$$

Thus, the filter core structure 310 is coupled to a first port (input port), at which the port impedance $Z_{P1}$ is presented, via the transformer 312, which can be considered as a first matching arrangement. Similarly, the filter core structure 310 is coupled to a second port, at which a second port impedance $Z_{P2}$ is presented, via the second transformer 314, which can be considered as a second matching arrangement.

The matching arrangements can be implemented in many different ways. By principle, the transformers 312, 314 could be realized by two coupled inductors, but this structure has a limited working bandwidth (in particular, it presents zero DC transmission) and is difficult to realize at high frequencies (in the order of 10 GHz and more). An alternative implementation could be the multi-section λ/4 transmission line transformer, which can potentially operate at higher frequencies and presents lower attenuation, but typically presents large size.

3.4. Design of an Impedance-Scaled Filter According to FIG. 3c

Considering this, an embodiment according to the invention exploits the impedance transforming properties of a L network consisting of series inductor with a shunt capacitor.

FIG. 3c shows an exemplary realization of a filter 340 with two of such impedance transforming networks ($L_0$, $C_0$). In other words, FIG. 3c shows a schematic of a filter derived from the filter of FIG. 3a after scaling the internal impedance, with a L-network implementation of the ideal transformers.

After the application of this network transformation, there are two couples of series inductors $L_0+L_1'$ at the input and there are two couples of series inductors $L_N'+L_{N+1}$ at the output.

3.5. Design of an Impedance-Scaled Filter According to FIG. 3d

It is appreciated, each series couple $L_0 L_1'$, $L_N'L_0$ simplifies to one single inductor $L_1'+L_0$, $L_N'L_0$, as shown in FIG. 3d. In other words, FIG. 3d shows a schematic of a filter structure which is obtained from the filter structure of FIG. 3c by a rearrangement.

Thus, the inventive filter structure according to FIG. 3d increases the network complexity with two additional shunt capacitors only (when compared to the filter structure of FIG. 3a).

3.6. Filter Structure Details

In the following, the filter structure 300 of FIG. 3 will be explained in additional detail. The filter structure 300 comprises the filter core structure 310. The filter core structure 310 comprises a first port (input port) 310a and a second port (output port) 310b. Similarly, the filter structure 300 comprises a first port 300a (input port) and a second port 300b (output port). The input port 300a of the filter structure 300 is coupled to the source 610 and the output port 300b of the filter structure 300 is coupled to the load 620.

Furthermore, the transformer 612 is electrically coupled between the first port 300a of the filter structure 300 and the first port 310a of the filter core structure 310. For example, a first winding of the transformer 312 is coupled to the first port 300a of the filter structure 300, and a second winding of the transformer 312 is coupled to the first port 310a of the filter core structure 310. A transformation ratio between the first winding and the second winding of the transformer 312 may be n:1. Similarly, the second port 312b of the filter core structure 310 is coupled to a first winding of the transformer 314, and the second port of the filter structure 300 is coupled to a second winding of the transformer 314. A transformation ratio between the first winding and the second winding of the transformer 314 may be 1:n.

The filter core structure 310 comprises a plurality of series inductors electrically coupled between the first port 310a and the second port 310b, wherein the series inductances are designated with $L_1'L_3' \ldots L_{N-2}' L_N'$. Shunt impedance elements $L_2'$-$C_2'$, $L_4'$-$C_4$, $L_{N-3}'$-$C_{N-3}'$, $L_{N-1}'C_{N-1}'$ are electrically coupled to nodes, which are arranged electrically coupled between two subsequent of the series inductances $L_1'$ to $L_N'$. Some or all of the shunt impedance elements comprise, for example, a series resonance circuit comprising a pair of inductance (for example, $L_2'$) and a corresponding capacitance (for example, $C_2'$).

In the following, additional details regarding the filter structure 340 shown in FIG. 3c will be described. It should be noted that here that the filter structure 340 differs from the filter structure 300 only in that the transformers 312, 314 are replaced by L networks 342, 344. A series inductance $L_0$ is electrically coupled between a first port 300a of the filter structure 340 and the first port 310a of the filter core structure 310. In addition, a shunt capacitance $C_0$ is electrically coupled in parallel with the first port 300a of the filter structure 340. Similarly, a series inductance $L_0$ is electrically coupled in series between the second port 310b of the filter core structure 310 and the second port 300b of the filter structure 340. In addition, a shunt capacitance $C_0$ is electrically coupled in parallel with the second port 300b.

It should be noted that the inductance $L_0$ of the first (input-sided) L matching arrangement 342 is in series with the inductance $L_1'$ of the filter core structure 310, and that the inductance $L_0$ of the second (output-sided) L matching arrangement 344 is in series with the inductance $L_N'$ of the filter core structure 310.

In the following, additional details regarding the filter structure 380 shown in FIG. 3d will be described. It should be noted that the filter structure 380 differs from the filter structure 340 in that the inductance $L_0$ of the matching arrangement 342 is merged with the first input-sided series inductance $L_1'$ of the filter core structure, to obtain a common matching-filter inductance $L_1+L_0$. Similarly, the inductance $L_0$ of the second L matching arrangement 344 is merged with the last output-sided series inductance of the filter core structure 310, to obtain a common filter-matching inductance $L_N'+L_0$. Apart from these modifications, the explanations regarding the filter structure 340 also apply.

4. PERFORMANCE EVALUATION

In the following, the performance of the filter structures 600 and 380, according to FIGS. 3a and 3d will be compared.

The filter structure 380 comprises an internal impedance (impedance of the filter core structure, which is also designated as "working impedance") of 25 Ohm. The external impedance (impedance presented at the external ports of the filter structure) is 50 Ohm.

Figure 4:
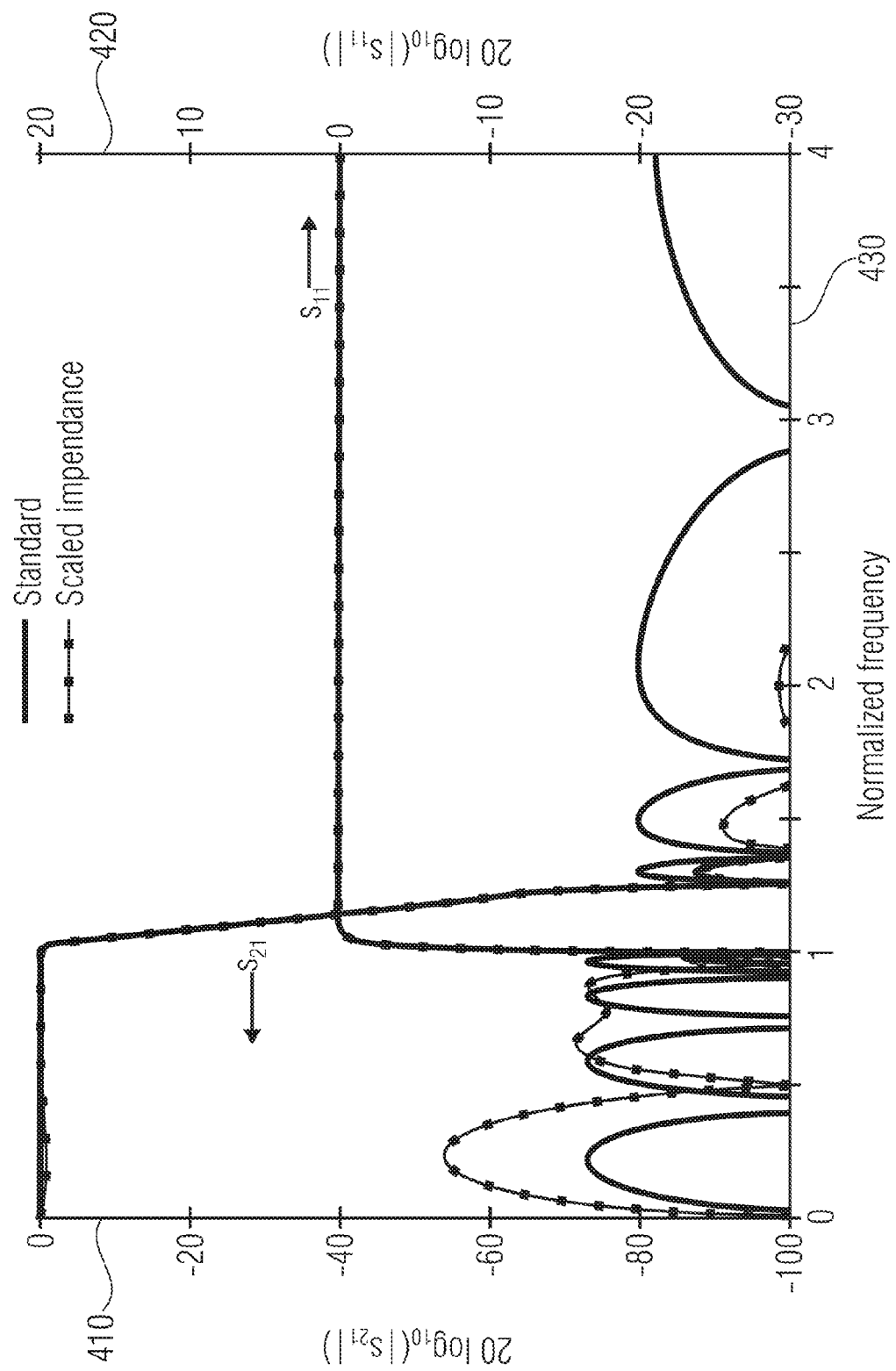
FIG. 4 shows a graphical representation of responses of a standard filter and of a scaled impedance filter.

FIG. 4 shows a plot of the responses of two ninth order low pass filter having a structure of FIG. 3a (gray lines) and FIG. 3d (black lines). In other words, FIG. 4 shows a graphical representation of responses of a standard filter (black lines) and of a scaled impedance filter (gray lines or dashed lines). The transmission coefficient ($c_{21}$) and the reflection coefficient $c_{11}$ of the two filters are plotted on the left and right y-axis (ordinate) 410, 420, respectively. Further, the frequency axis (abscissa) 430 is normalized to the cut off frequency $f_t$.

It can be noted that the scaled-impedance low pass filter (SILPF) presents almost the same impedance matching performances as the standard low pass filter LPF in a frequency range from $0.44 \times f_t$ to $f_t$. Below that lower limit, the scaled impedance filter performs worse than the standard one, although still transmitting the signal.

Moreover, in the important application of low pass filters as harmonic signal cleaner, the input frequency range is narrower than 1 octave. Therefore, the above-described limited working bandwidth is a non issue.

In the following, some advantages will be discussed, which can be obtained if the filter structure 380 according to FIG. 3d is implemented using a semi-lumped implementation. In such a semi-lumped implementation (or realization), inductances are placed by transmission line portions having an impedance which is higher than a working impedance of the filter core structure (e.g., higher than a characteristic impedance presented at a port of the filter core structure). Similarly, capacitances are implemented using transmission line portions having an impedance which is lower than a working impedance of the filter core structure (e.g., a characteristic impedance presented at a port of the filter core structure).

Passing from the ideal to a practical semi-land realization, the filter structure 380 of FIG. 3d offers, among others, the following three advantages:

1. Lower degradation of the inductor performances associated with their parasitic shunt capacitances because of the reduced internal impedance (also designated as working impedance) of the filter (or filter core structure) that causes lower voltages across the parasitic capacitances themselves.
2. Reduced inductance values, as a straightforward consequence of the equation (2) when assuming $R_{FILT} < R_G$, $R_{FILT} < R_L$, as per our hypothesis. As a trend, this also reduces the inductor size and associated parasitic capacitance to ground, reinforcing 1.
3. The stop-band attenuation of the scaled impedance filter is higher than the one of the corresponding standard solution as a consequence of the low-pass behavior of the L-network transformer ($L_0$, $C_0$).

From equation (3) and with the same assumptions as in 2, it also follows that the scaled impedance low-pass filter has higher capacitance values than its standard counterpart. However, this does not give bigger capacitor size, because the higher capacitance is achievable by means of closer ground planes in the transmission lines realizing the capacitors themselves.

5. FILTER IMPLEMENTATION ACCORDING TO FIGS. 5a, 5b AND 5c

In the following, an exemplary implementation of the filter structure 380 of FIG. 3d will be discussed.

Figure 5B:
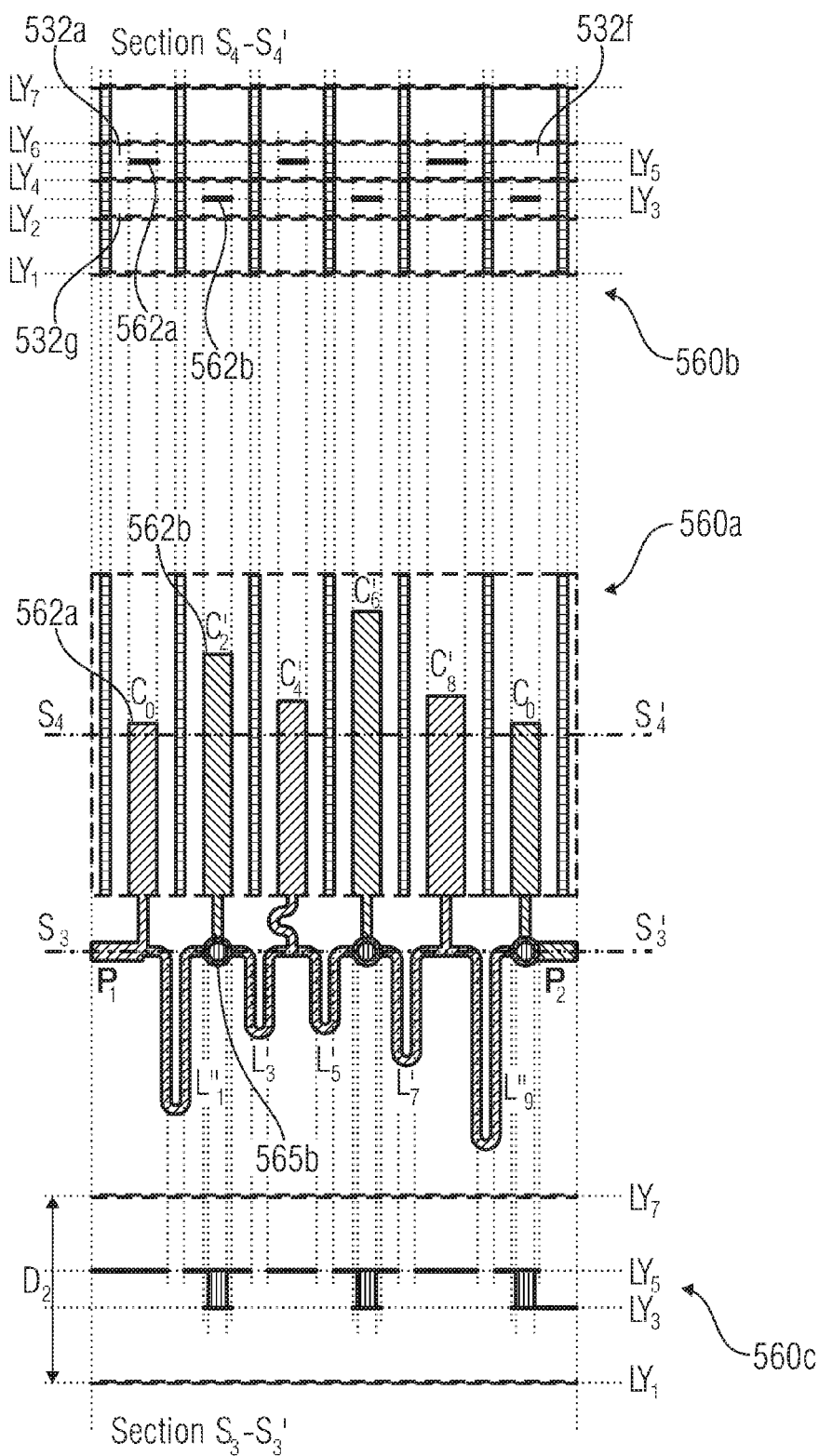
FIG. 5b shows a graphical representation of a second filter of an interleaved realization of two filters in a multi-layer printed circuit board.
Figure 5C:
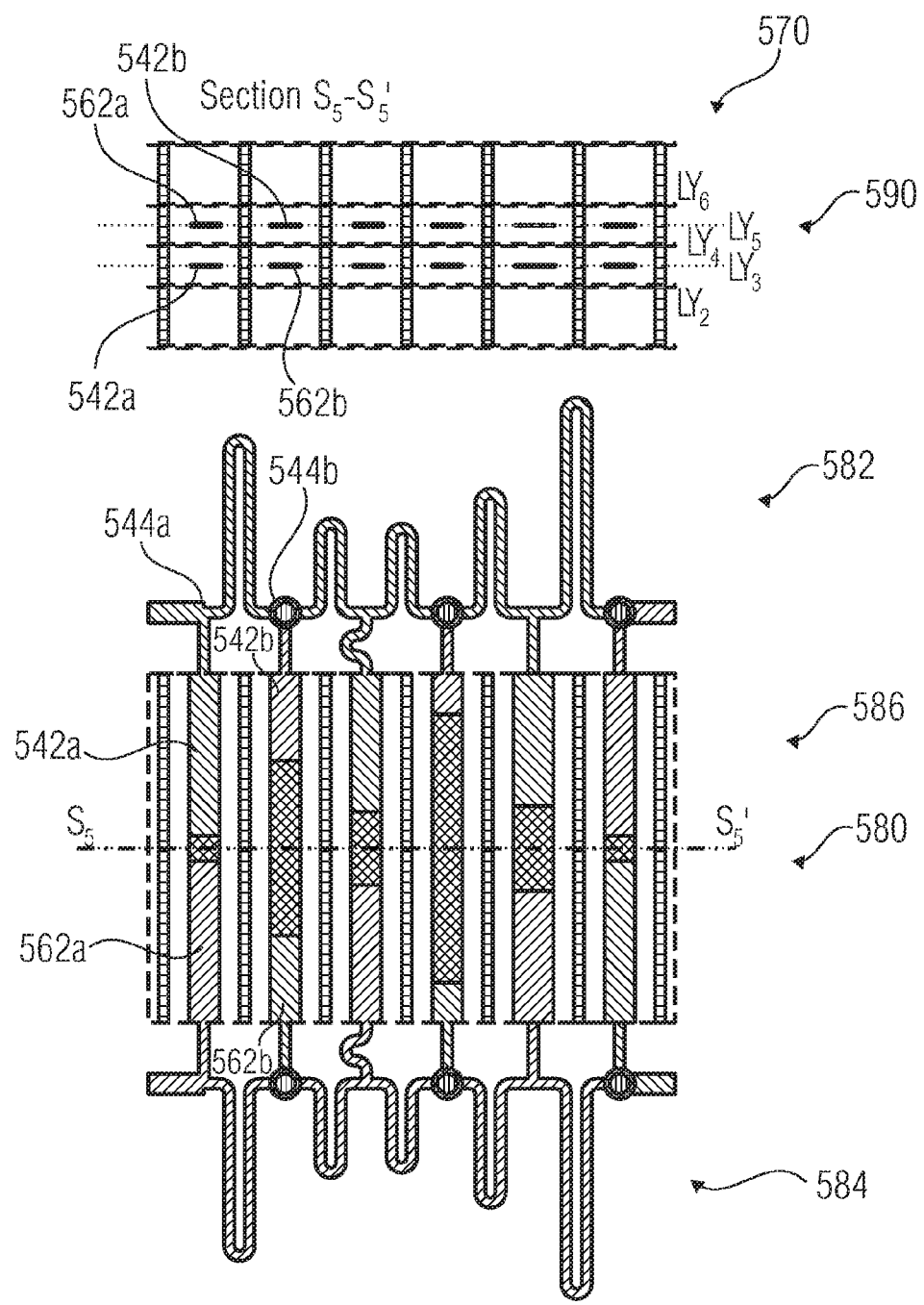
FIG. 5c shows a graphical representation of the result of an interleaving of the first filter according to FIG. 5a and the second filter according to FIG. 5b within the same substrate.

However, it should be noted that the implementation embodiments of the present invention described with reference to FIGS. 5a, 5b and 5c is also applicable in the absence of the matching arrangement, e.g. if the capacitors $C_0$ are omitted and the inductance $L_1'+L_0$ is replaced by the inductance $L_1'$ and the inductance $L_N'+L_0$ is replaced by the inductance $L_N'$. Also, it should be noted that the implantation embodiments of the present invention shown in FIGS. 5a, 5b and 5c can be applied independent on the actual impedance level of the filter structure or filter core structure. Moreover, it should be noted that the implementation embodiments of the present invention shown in FIGS. 5a, 5b and 5c can be used for both implementation of a single filter (as shown in FIGS. 5a and 5b) and for the implementation of double filter (as shown in FIG. 5c).

It should be noted that the implementation embodiments of the present invention, which is shown in FIGS. 5a, 5b and 5c, is particularly suited for the implementation of a SILPF filter structure using a multi-layer structure, like a multi-layer printed circuit board. For example, a printed circuit board using a FR4 material may be used in some embodiments. However, other materials are also well suited, like, for example, low-temperature co-fired ceramic multi-layer structures.

It should be noted that in an advantageous embodiment, the filter structure is implemented using a multi-layer structure comprising seven conducting layers $LY_1$ to $LY_7$, which are arranged in the order $LY_1$, $LY_2$, $LY_3$, $LY_4$, $LY_5$, $LY_6$, $LY_7$, with a dielectric layer in between any two adjacent conducting layers.

FIG. 5a shows, at reference numeral 510, a top view of a first single filter structure. A first cross sectional view, taken at a line $S_2S_2'$, is shown at reference numeral 520, and a second cross sectional view, taken at a line $S_1S_1'$, is shown at reference numeral 530. It is appreciated, an input feed line 512a is arranged in a third conducting layer $LY_3$, and an output feed line 512b is arranged in a fifth conducting layer $LY_5$.

A plurality of, for example, five (high-impedance) transmission lines (or transmission line portions) implementing inductances $L''_1$, $L'_3$, $L'_5$, $L'_7$, $L''_9$ are electrically coupled between the input feed line 512a and the output feed line 512b. Each of the transmission line portions implementing the inductances $L''_1$, $L'_3$, $L'_5$, $L'_7$, $L''_9$ comprises a U-shaped extension. It should also be noted that all of the transmission lines implementing the inductances $L''_1$, $L'_3$, $L'_7$, $L''_9$ are arranged in the third conducting layer $LY_3$. Also, it should be noted that said transmission line portions are arranged in a portion 582 (also designated as "outer portion" or "outer region" sometimes) of the filter structure in which the second conducting layer LY2, the fourth conducting layer LY4 and the sixth conducting layer LY6 are left blank, such that said transmission line portions form strip line structures with the conducting layers $LY_1$, $LY_7$ acting as the ground layers of the strip line structure. Accordingly, there is a comparatively large distance between said transmission line portions (in layer LY3) implementing the inductances $L''_1$, $L'_3$, $L'_5$, $L'_7$, $L''_9$ and the corresponding ground layers LY1, LY7, such that a sufficiently high impedance of said transmission lines can be obtained with reasonable (yet comparatively small) width of the transmission lines.

In the following, details regarding the shunt impedance elements will be discussed, which are coupled to nodes which are electrically coupled between the individual transmission line portions implementing the series inductances $L''_1$, $L'_3$, $L'_7$, $L''_9$.

Regarding the shunt impedance elements, it should be noted that the shunt impedance elements typically comprise a series connection of an inductive portion and of a capacitive portion. The inductive portion is typically represented by a comparatively narrow (higher impedance) transmission line portion, sometimes in combination with a via inductance. The capacitive portion is implemented by a comparatively wide (lower impedance) transmission line portion having a smaller transmission line impedance than the comparatively narrow transmission line portion. In the implementation of the capacitive portions, a special region 540 (also sometimes designated as "central region" 586) is used, in which the conducting layers $LY_2$, $LY_4$ and $LY_6$ are provided with ground planes.

In the central region 540, two rows of substantially brick-shaped subregions 532a to 532f and 532g to 532l are formed. Electrically shielded subregions 532a to 532f of the first row of electrically shielded subregions are arranged between ground layers formed in the conducting layers $LY_4$ and $LY_6$. Adjacent electrically shielded regions 532a to 532f are separated from each other by vertical ground structures 534a to 534e, which may be formed using trenches or rows of vias extending in a direction from one main surface of the multi-layer structure to another main surface of the multi-layer structure. Nevertheless, the electrically shielded regions may be open at two sides in some embodiments. Nevertheless, it is sufficient if the electrically shielded subregions are open at one side.

In the following, details regarding the implementation of the shunt impedance elements will be described. For example, a first shunt impedance element comprises a low impedance transmission line portion 542a, which is formed in the conducting layer $LY_3$ and which is further arranged within an electrically shielded subregion 532g bounded by ground layers in the electrically conducting layers $LY_2$ and $LY_4$ and vertical ground structures 533, 534a. The low impedance transmission line portion 542a is coupled with a node 544a via a high impedance transmission line portion 543a, wherein the node 544a is at a transition from the input feed line 512a to a transmission line structure implementing the inductance $L''_1$. Further, a low impedance transmission line portion 542b is arranged in the conducting layer $LY_5$ and within an electrically shielded subregion 532b, which is bounded by ground layers in the conducting layers $LY_4$ and $LY_6$ and the vertical ground structures 534a, 534b. The low impedance transmission line portion 542b is coupled to a node 544b using a high impedance transmission line 543b and a via 545b (extending between the layer LY3 and the layer LY5). Accordingly, the inductance of the via 545b and the inductance of the high impedance transmission line portion 543b are effective in series with the low impedance transmission line portion 542b. Accordingly, the via 545b and the high impedance transmission line portion 543b implement the inductance $L'_2$, and the capacitance $C'_2$ is implemented by the low impedance transmission line 542b. Similarly, the impedance $C'_4$ is implemented by a low impedance transmission line portion 542c, the inductance $L'_4$ is implemented by a high impedance transmission line portion 543c, and so on.

In FIG. 5a, schematic symbols of the capacitances and inductances implemented by the transmission line portions and vias are noted next to the respective elements. Also, the layers in which said transmission line portions and vias are arranged can be seen from the cross sectional views at reference numerals 520 and 530 and also from the hatching of said transmission line portions.

It should be noted that nodes, at which the high impedance transmission line structures implementing the series inductances $L''_1$, $L'_3$, $L'_5$, $L'_7$, $L''_9$ are linked with each other and with the structures implementing the shunt impedance elements are advantageously arranged along a line between a filter input and a filter output. Also, the center region 540 (also designated with 586) is advantageously rectangular in a top view onto the multi-layer structure, such that the low imped-ance transmission line structures 542a, 542b, 542c implementing the capacitances of the shunt impedance elements advantageously all start along a boundary line 550 between the outer region 582 and the central region 586. Thus, the low impedance transmission line portions 542a, 542b, 542c implementing the capacitances of the shunt impedance elements are entirely arranged within the central region 586, e.g. within the electrically shielded subregions formed within the central region.

In the following, the particular arrangement of a second filter structure will be discussed taking reference to FIG. 5b, which shows a top view at reference numeral 560a, a first cross-sectional view (taken at a line S4S4') at reference numeral 560b, and a second cross-sectional view (taken at line S3S3') at reference numeral 560c.

It should be noted that the same element symbols (for example $L''_1$, $L'_3$, $L'_5$, $L'_7$, $L''_9$, $C_0$, $C'_2$, $C'_4$, $C'_6$, $C'_8$, $C_0$) are used for the discussion of the second filter structure when compared to the first filter structure. Nevertheless, it should be noted that the second filter structure is electrically independent from the first filter structure, such that the first filter structure and the second filter structure may forward a signals which are electrically independent from each other.

It is appreciated from a comparison of FIGS. 5a and 5b, the second filter structure is approximately axial symmetrical to the first filter structure. However, the low-impedance transmission line structures used to implement the shunt impedance elements of the second filter structure are arranged in different electrically shielded subregions than the low-impedance transmission line structures used to implement the shunt impedance elements of the first filter structure.

For example, while the low impedance transmission line portion 542a is arranged within the electrically shielded subregion 532g, the low impedance transmission line portion 562a is arranged within the electrically shielded subregion 532a. Thus, corresponding low-impedance transmission line portions 542a, 562a of the first filter structure and of the second filter structure are arranged in different conducting layers (for example, conducting layer $LY_3$ versus conducting layer LY5), and are enclosed (for example at four sides) in vertically adjacent electrically shielded subregions 532g, 532a.

Also, it should be noted that the low impedance transmission line structures used to implement the shunt impedance elements of one of the filter structures are not all arranged in the same electrically conducting layer, but in different electrically conducting layers. For example, some of the low impedance transmission line structures used to implement shunt impedance elements of the first filter structure are arranged in a conducting layer $LY_3$, and some other of the low impedance transmission line structures used to implement shunt impedance elements of the first filter structure are arranged in the conducting layer $LY_5$.

This allows to make use of via inductances for the implementation of the shunt impedance elements.

Also, the first filter structure (shown in FIG. 5a) and the second filter structure (shown in FIG. 5b) use "complementary" conducting layers for corresponding shunt impedance elements, such that a shunt impedance element of the second filter structure is implemented in the layer LY5 and the corresponding shunt impedance element of the first filter structure is implemented in the layer $LY_3$, and vice versa.

Taking reference now to FIG. 5c, which shows a top view 580 and a cross sectional view 590 (taken at a line $S_5S_5'$) of a double filter structure comprising both the first filter structure of FIG. 5a and the second filter structure of FIG. 5b, it can be seen that the inductances of the first filter structure are implemented using high impedance transmission line portions and vias, which are arranged in a first outer portion 582. Inductances of the second filter structure are implemented using high impedance transmission lines and vias which are arranged in a second outer portion 584. Capacitances of both the first and the second filter structures are implemented in a central region 586 of the double filter structure. It is appreciated, the low impedance transmission line portions used to implement the shunt impedance elements of the first and second filter structure overlap in a projection (top view 580) perpendicular to a main surface (or a conducting layer) of the multi-layer structure. However, the ground layer LY4 is naturally between low impedance transmission line portions of the first and second filter structure. It should also be noted that the overlap regions are shown by a cross-hatching in FIG. 5c.

In the following, the double filter structure, which is explained with reference to FIGS. 5a, 5b and 5c, will be briefly summarized. FIG. 5a shows one possible realization of the scaled-impedance low-pass filter with a multi-layer printed circuit. More precisely, FIG. 5a shows a 9-th order elliptic filter (also known as a "Cauer" filter). FIG. 5 shows an interleaved realization of two filters in multi-layer PCB, wherein FIG. 5a shows a first filter, FIG. 5b shows a second filter and FIG. 5c shows an interleaving of the filters of FIGS. 5a and 5b within the same substrate.

That structure consists of six stacked dielectric layers with seven metal layers $LY_1$ to $LY_7$ in between. The high impedance lines realizing the series inductors have the two extreme metal layers $LY_7$ and $LY_1$ as ground planes, as shown in the cross section $S_2$-$S_2'$ at reference numeral 520. It should be noted that the more external inductors $L_1''$ and $L_9''$ also embed $L_0$. Therefore, it is $L_1''=L_0'+L_1'$ and $L_9''=L_0'+L_9'$.

As anticipated, the ground planes for the capacitor transmission lines ($C_0$, $C_2'$, $C_4'$, $C_6'$, $C_8'$, $C_O$) are closer to the relative strip line (or strip line signal line), for example layers $LY_2$, $LY_4$ for $C_0$, $C_4'$, $C_8'$ and layers $LY_4$, $LY_6$ for $C_2'$, $C_6'$, $C_O$. This can be seen in the section $S_1$-$S_1'$, which is shown at reference numeral 530. Furthermore, the strip line metallization (e.g., of the strip line signal line) of inductors and capacitors are alternatively realized on the metal layers $LY_3$ and $LY_5$.

All the different ground planes (for example, layers $LY_1$, $LY_2$, $LY_4$, $LY_6$ and $LY_S$) are connected together by means of via structures (for example, vertical ground structures 533, 534a, 534b, 534c, 534d, 534e, 535).

From an inspection of the section $S_1$-$S_1'$, which is shown at reference numeral 530, it is possible to see that above (below) the capacitors $C_0$, $C_4'$, $C_8'$ ($C_2'$, $C_6'$, $C_0$), which are implemented using low impedance transmission line portions, there is an empty place between the layers $LY_4$, $LY_6$ ($LY_2$, $LY_4$). That empty space is completely shielded from the adjacent capacitors from the ground planes and the via structures (or by means of the ground planes LY2, LY4, LY6 and the via structures 533, 534a to 534e, 535).

It has been found that it (the empty space, which is also designated as an electrically shielded region or subregion) can therefore be used to insert capacitors belonging to another filter (also designated as filter structure), if this has the alternative structure with respect of the one in FIG. 5a, e.g. the one in FIG. 5b.

This second filter (or filter structure), which is shown in FIG. 5b, realizes the capacitors $C_0$, $C_4'$, $C_8'$ where the one in FIG. 5a (e.g. the first filter structure) realizes the capacitors $C_2'$, $C_6'$, $C_0$, and vice versa.

FIG. 5c depicts the resulting structure coming from the interleaved combinations of the ones in FIGS. 5a and 5b. It can be seen that all the capacitors of any filter are mutually isolated, and that the area for two filters is approximately 1.5 times the area for one single filter.

Accordingly, two electrically well-isolated filters or filter structures can be implemented using the common central portion 586. Accordingly, the implementation is space-efficient.

6. EXEMPLARY DIMENSIONS

Figure 7:
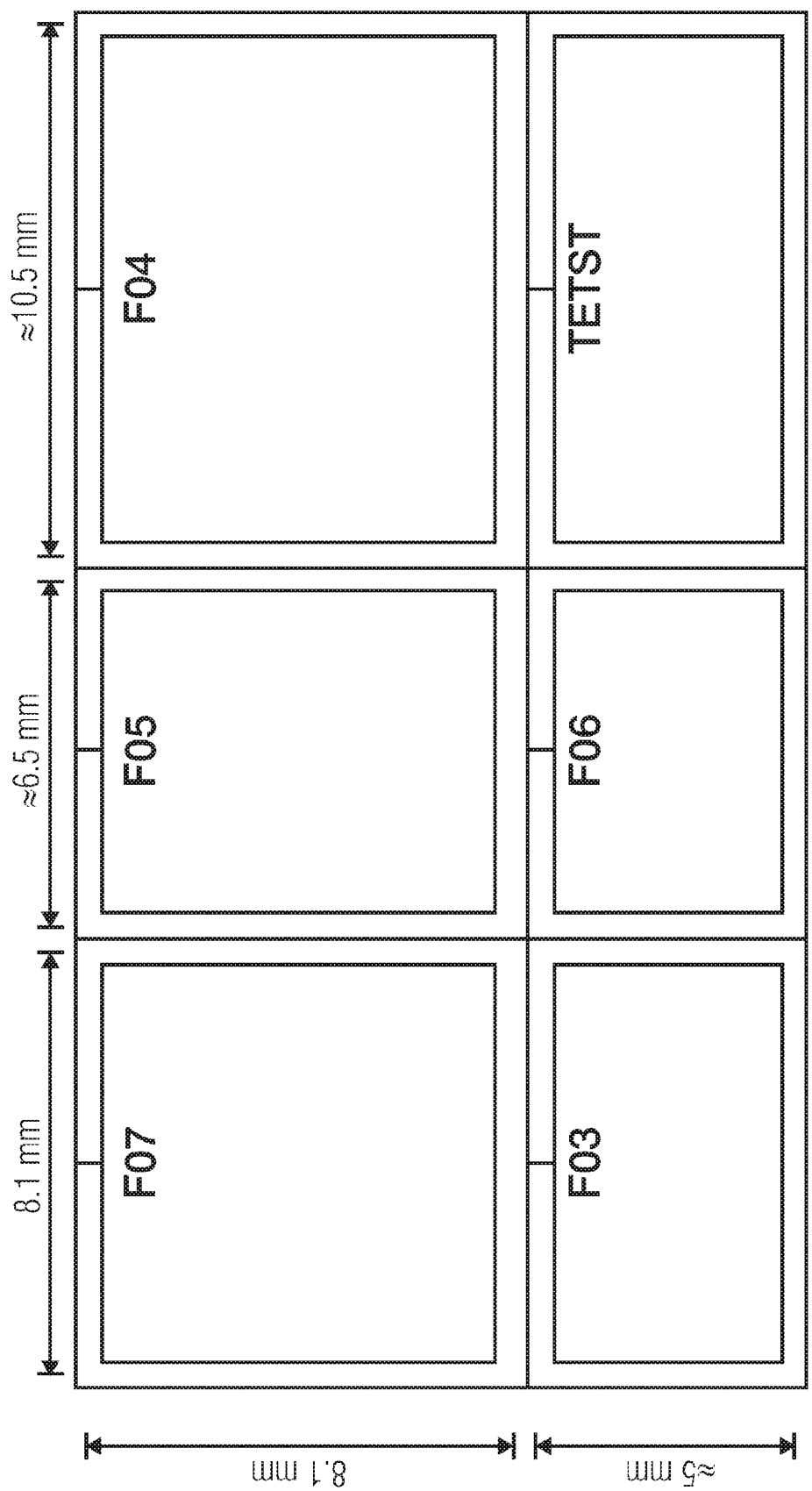
FIG. 7 shows a graphical representation of a mask set for fabrication of five filters and a test structure.

In the following, dimensions of some embodiments according to the invention will be briefly discussed taking reference to FIG. 7, which shows a mask set of a LTCC filter.

The masked set represented in FIG. 5 comprises five filters F03, F04, F05, F06 and F07. Also, the masked set comprises a test structure TETST.

It is appreciated, the dimension of the smallest filter F06 may be approximately 5 mm×6.5 mm. A dimension of the largest filter may be approximately 8.1 mm×8.1 mm. It can be seen here that filters can be implemented using a space which may be smaller than 100 mm². The thickness of the multi-layer structure may be typically in the range of 1 mm for instance, and a relative permittivity of the dielectric layers of the multi-layer structure may be typically of the order of $\in_r=8$ for instance.

However, different dimensions are naturally possible, depending on the requirements of the filter.

7. CONCLUSION

In the following, some aspects of embodiments of the present invention will be briefly summarized.

An embodiment according to the invention creates a method to reduce a sensitivity of a standard lumped filter, which is shown in FIG. 3a, to parasitic shunt capacitances associated with each inductor by; scaling the internal impedance of the filter; and matching the input and output of the filter with a passive network to the desired external impedance.

In an advantageous embodiment, the passive matching network is a L-network.

In another advantageous embodiment, the passive matching network is a Π-network.

In another advantageous embodiment, the passive matching network is a T-network.

In another advantageous embodiment, the passive matching network consists of multiple cascaded L-networks.

In an advantageous embodiment, the passive matching network is optionally merged with front and tail inductors of the internal filter.

In an advantageous embodiment, the desired filter is a low-pass filter.

In another advantageous embodiment, a smaller physical arrangement can be achieved where capacitances are interleaved in stacked layers.

Using an embodiment according to the invention, some or all of the advantages discussed above can be obtained. Alternatively, or in addition, a reduced size can be achieved if the structure described with reference to FIGS. 5a, 5b and 5c is used. For example, two filters can be implemented in approximately 1.5 times the area needed for the implementation of a single filter.

To further summarize, embodiments according to the invention create an impedance scaled low-pass filter. A filter structure according to an embodiment of the invention can be designed on the basis of a standard semi-lumped low-pass filter, which is a very well known solution. The design of such a standard semi-lumped low-pass filter is described, for example, in the book "Electronic Filter Design and Simulation" by Giovanni Bianchi and Roberto Sorrentino (McGraw-Hill May 2007, section 5.1) and the associated references. Some embodiments according to the invention solve the problem that the parasitic shunt impedance associated with the series inductors degrades the stop-band response of the filter. Accordingly, embodiments according to the invention bring along a wide number of advantages. For example, embodiments according to the invention allow the realization of smaller filters with better stop-band performances (wider clean stop-band with higher rejection). Moreover, an exemplary implementation of the invention itself permits to pack two filters in the size of 1.5 filters, with a further reduction of the size.

8. IMPLEMENTATION ALTERNATIVES

It should be noted that the above described filter structure can be varied over a wide range. For example, embodiments according to the invention are not limited to low-pass filter structures. Rather, it is possible to implement bandpass filter structures or high-pass filter structures. Also, the embodiments according to the invention are not limited to a certain filter order. Rather, filters of different orders can be designed, as it is well known to a man skilled in the art. Also, different filter types may be desired, like, for example, Chebyshev filters, Butterworth filters, Cauer filters, and so on. It should also be noted that the conducting layers can be implemented using a wide variety of materials like, for example, copper, aluminum, gold, and so on. Also, the dielectric layers may be implemented using different materials which are well known to a man skilled in the art. Also, the dielectric constant of the dielectric layers may vary, for example between 1.5 and 100, wherein different choices are also possible. The thickness of the layers may also vary, for example, between 1 µm and 1 cm.

While these inventions have been described in terms of several embodiments, there are alterations, permutations, and equivalents which fall within the scope of the inventions. It should also be noted that there are many alternative ways of implementing the methods and compositions of the present inventions. It is therefore intended that the following appended claims be interpreted as including all such alterations, permutations and equivalents as fall within the true spirit and scope of the present inventions.

The invention claimed is:

1. An electrical filter for forwarding a first electrical signal from a first filter port to a second filter port in a first frequency-selective manner, and for forwarding a second electrical signal from a third filter port to a fourth filter port in a second frequency-selective manner, the filter comprising:
a first filter core comprising the first filter port, the second filter port, a plurality of series impedance elements coupled between the first filter port and the second filter port and a plurality of shunt impedance elements,
wherein the shunt impedance elements of the first filter core are implemented using transmission lines coupled to nodes, wherein a first shunt impedance element is electrically coupled between impedance elements coupled in series of the first filter core;
a second filter core comprising the third filter port, the fourth filter port, a plurality of series impedance elements coupled between the third filter port and the fourth filter port and a plurality of shunt impedance elements,
wherein the shunt impedance elements of the second filter core are implemented using transmission lines coupled to nodes, wherein a second shunt impedance element is electrically coupled between impedance elements coupled in series of the second filter core; and
wherein the shunt impedance elements of the first filter core are arranged in first and second conducting layers of a multi-layer structure and the shunt impedance elements of the second filter core are arranged in third and fourth conducting layers of the multi-layer structure, wherein the multi-layer structure is located between the first filter structure and the second filter structure.

2. The electrical filter according to claim 1,
wherein a transmission line used to implement a first shunt impedance element of the first filter core and a transmission line used to implement a second shunt impedance element of the second filter core are arranged in the first conducting layer of the multi-layer structure; and
wherein a transmission line used to implement a second shunt impedance element of the first filter core and a transmission line used to implement a first shunt impedance element of the second filter core are arranged in the second conducting layer of the multi-layer structure.

3. The electrical filter according to claim 2,
wherein the transmission line used to implement the first shunt impedance element of the first filter core and the transmission line used to implement the first shunt impedance element of the second filter core are at least partly overlapping in a projection perpendicular to a main surface of the multi-layer structure with a conductive shielding disposed in between; and
wherein the transmission line used to implement the second shunt impedance element of the second filter core and the transmission line used to implement the second shunt impedance element of the first filter core are at least partly overlapping in a projection perpendicular to a main surface of the multi-layer structure with a conductive shielding in-between.

4. The electrical filter according to claim 3,
wherein the main surface is parallel to the conducting layers.

5. The electrical filter according to claim 3,
wherein the main surface is formed by a top conducting layer or a bottom conducting layer.

6. The electrical filter according to claim 1,
wherein the shunt impedance elements of the first filter core are arranged in different conducting layers of the multi-layer structure, such that a via impedance is arranged in series with at least one of the shunt impedance elements of the first filter core; and
wherein the shunt impedance elements of the second filter core are arranged in different conducting layers of the multi-layer structure, such that a via impedance is arranged in series with at least one of the shunt impedance elements of the second filter core.

7. The filter according to claim 2,
wherein the transmission lines used to implement the shunt impedance elements of the first filter core are alternatingly arranged in a first conducting layer and a second conducting layer of the multi-layer structure; and
wherein transmission lines used to implement shunt impedance elements of the second filter core are alternatingly arranged in the second conducting layer and the first conducting layer of the multi-layer structure.

8. The filter according to claim 7, wherein a plurality of corresponding pairs of transmission lines of the first and second filter cores are at least partially overlapping in a projection perpendicular to a main surface of the multi-layer structure with a conducting shielding disposed in between.

9. The filter according to claim 1, wherein the filter comprises at least two rows of electrically shielded regions bounded by ground layers of the multi-layer structure and vertical ground structures of the multi-layer structure,
   wherein the two rows of electrically shielded regions are arranged stacked in a direction perpendicular to a main surface of the multi-layer structure,
   wherein transmission lines used to implement shunt impedance elements of the first filter core are alternatingly arranged in electrically shielded regions of an upper one of the rows and electrically shielded regions of a lower one of the rows; and
   wherein transmission lines used to implement shunt impedance elements of the second filter core are alternatingly arranged in electrically shielded regions of the upper one of the rows and electrically shielded regions of the lower one of the rows in which there are no transmission lines used to implement the shunt impedance elements of the first filter core.

10. The filter according to claim 9, wherein the transmission lines used to implement the shunt impedance elements of the first and second filter cores are arranged such that electrically shielded regions of a row of electrically shielded regions comprise an interleaved sequence of transmission lines of the first filter core and transmission lines of the second filter core.

11. The filter according to claim 2, further comprising three parallel ground layers, wherein the three parallel ground layers are connected by a plurality of parallel vertical ground structures to achieve a plurality of substantially brick-shaped electrically shielded regions bounded at four sides by two of the ground layers and two of the parallel vertical ground structures; and
   wherein the transmission line used to implement the first shunt impedance element of the first filter core is arranged in a first of the brick-shaped electrically shielded regions.

12. The filter according to claim 11, wherein the transmission line used to implement the first shunt impedance element of the second filter core is arranged in a second of the brick-shaped electrically shielded regions, which is vertically adjacent to the first brick-shaped electrically shielded region;
   wherein the transmission line used to implement the second shunt impedance element of the first filter core is arranged in a third of the brick-shaped electrically shielded regions, which is horizontally adjacent to the second brick-shaped electrically shielded region; and
   wherein the transmission line used to implement the second shunt impedance element of the second filter core is arranged in a fourth of the brick-shaped electrically shielded regions, which is horizontally adjacent to the first brick-shaped electrically shielded region and vertically adjacent to the third brick-shaped electrically shielded region.

13. The filter according to claim 1, wherein the first filter core is configured to forward a first signal; and
   wherein the second filter core is configured to forward a second signal, which is electrically separated from the first signal.

14. The filter according to claim 1, wherein the filter comprises a central portion, the central portion comprising at least three ground layers comprising a first spacing d between adjacent ones of the ground layers;
   wherein the filter comprises a first outer portion, the first outer portion comprising an upper ground layer and a lower ground layer comprising a second spacing $D_1$;
   wherein the filter comprises a second outer portion, the second outer portion comprising an upper ground layer and a lower ground layer comprising a third spacing $D_2$;
   wherein the central portion is arranged between the first outer portion and the second outer portion;
   wherein transmission line portions used to implement the series impedance elements of the first filter core are arranged in the first outer portion, such that the transmission line portions used to implement the series impedance elements of the first filter core are symmetric or asymmetric strip lines comprising a total strip line height of $D_1$;
   wherein transmission line portions used to implement the series impedance elements of the second filter core are arranged in the second outer portion, such that the transmission line portions used to implement the series impedance elements of the second filter core are symmetric or asymmetric strip lines comprising a total strip line height of $D_2$;
   wherein transmission line portions used to implement capacitances of the shunt impedance elements are arranged between two adjacent ground layers of the central portion, such that the transmission line portions used to implement capacitances of the shunt impedance elements of the first and second filter cores are symmetric or asymmetric strip lines comprising a total strip line height of d; and
   wherein d is smaller than $D_1$ and wherein d is smaller than $D_2$.

15. The filter according to claim 14, wherein the shunt impedance elements comprise a high impedance portion, which extends from a node at which subsequent series impedance elements are coupled to a respective boundary between a respective one of the outer portions and the central portion, and a low impedance portion, which extends from the respective boundary towards a respective opposite boundary of the central region.

16. The filter according to claim 14, wherein the filter is axially symmetric with respect to a center axis located in the central region.

17. The filter according to claim 1, wherein the first filter core is a low pass filter, and wherein the second filter core is a low pass filter.

18. The filter according to claim 1, further comprising a sequence of seven conductive layers with dielectric layers between any two adjacent ones of the conductive layers; and
   wherein a first conductive layer is a top ground layer;
   wherein a second conductive layer is a first central region ground layer;
   wherein a third conductive layer is a first transmission line layer;
   wherein a fourth conductive layer is a second central region ground layer;
   wherein a fifth conductive layer is a second transmission line layer;
   wherein a sixth conductive layer is a third central region ground layer;
   wherein a seventh conductive layer is a bottom ground layer;
   wherein the series impedance elements are implemented using transmission lines arranged on the third conductive layer and the fifth conductive layer, which have associated the top ground layer and the bottom ground layer as their corresponding ground layers;
   wherein the shunt impedance elements are implemented using transmission lines arranged on the third conductive layer and the fifth conductive layer;

wherein high impedance portions of transmission lines used to implement the shunt impedance elements have associated the top ground layer and the bottom ground layer as their corresponding ground layers; and wherein low impedance portions of transmission lines used to implement the shunt impedance elements have associated the two layers out of the first central region ground layer, the third central region ground layer and the third central region ground layer associated as their corresponding ground layers.

19. The filter according to claim 1, further comprising a first port comprising a first characteristic port impedance and a second port comprising a second characteristic port impedance, wherein a working impedance of the first filter core is different from the first characteristic port impedance and from the second characteristic port impedance;

a first matching circuit coupled between the first port and the first filter core, wherein the first matching circuit is configured to perform an impedance matching between the first characteristic port impedance and a characteristic impedance presented by the first filter core to the first matching circuit; and a second matching circuit coupled between the second port and the first filter core, wherein the second matching circuit is configured to perform an impedance matching between the second characteristic impedance and a characteristic impedance presented by the first filter core to the second matching circuit.

20. The filter according to claim 19, wherein the characteristic port impedance of the first port is 50Ω, wherein the characteristic impedance of the second port is 50Ω, and wherein the working impedance of the first filter core is smaller than 30Ω.

* * * * *